United States Patent
Jiang et al.

(10) Patent No.: US 10,964,362 B2
(45) Date of Patent: Mar. 30, 2021

(54) THREE-PORT MEMORY CELL AND ARRAY FOR IN-MEMORY COMPUTING

(71) Applicant: Marvell Asia Pte, Ltd., Singapore (SG)

(72) Inventors: Zhewei Jiang, Oakland Gardens, NY (US); Muhammed Ahosan UL Karim, Fremont, CA (US); Xi Cao, Pleasanton, CA (US); Vivek Joshi, Santa Clara, CA (US); Jack M. Higman, Austin, TX (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/393,997

(22) Filed: Apr. 25, 2019

(65) Prior Publication Data
US 2020/0342921 A1    Oct. 29, 2020

(51) Int. Cl.
| | | |
|---|---|---|
| G11C 7/10 | (2006.01) | |
| G06N 3/08 | (2006.01) | |
| G11C 11/412 | (2006.01) | |
| G11C 16/26 | (2006.01) | |
| H03K 19/21 | (2006.01) | |

(52) U.S. Cl.
CPC ............ *G11C 7/1075* (2013.01); *G06N 3/084* (2013.01); *G11C 11/412* (2013.01); *G11C 16/26* (2013.01); *H03K 19/215* (2013.01)

(58) Field of Classification Search
CPC ..... G11C 7/1075; G11C 11/412; G11C 16/26; G06N 3/084; H03K 19/215
USPC ..... 365/230.05, 230.06, 230.08, 189.04, 154
See application file for complete search history.

(56) References Cited

U.S. PATENT DOCUMENTS

| | | | | |
|---|---|---|---|---|
| 7,009,871 B1* | 3/2006 | Kawasumi | ............... | G11C 8/16 365/154 |
| 9,786,359 B2* | 10/2017 | Liaw | ..................... | A63B 23/02 |
| 10,521,229 B2* | 12/2019 | Shu | ........................ | G11C 11/418 |
| 2014/0078817 A1* | 3/2014 | Bentum | ............. | G11C 11/4091 365/154 |

(Continued)

OTHER PUBLICATIONS

Valavi et al, "A Mixed-Signal Binarized Convolutional-Neural-Network Accelerator Integrating Dense Weight Storage and Multiplication for Reduced Data Movement," IEEE Symposium on VLSI Circuits, 2018, pp. 1-2.

(Continued)

*Primary Examiner* — Connie C Yoha

(57) ABSTRACT

Disclosed is a three-port static random access memory (3P-SRAM) that performs XNOR operations. The cell has a write port and first and second read ports. Read operations are enabled through either the first read port using a first read wordline and a common read bitline or the second read port using a second read wordline and the common read bitline. Read wordline activation is controlled such that only one read wordline is activated (i.e., receives a read pulse) at a time. As a result, a read operation through either read port effectively accomplishes an XNOR operation. Also disclosed is a memory array, which incorporates such cells and which performs XNOR-bitcount-compare functions. Since XNOR-bitcount-compare functions are used in XNOR-NET type binary neural networks (BNNs), the memory array can be employed for implementing such a BNN designed for improved performance, scalability, and manufacturability. Also disclosed is an in-memory computing method.

20 Claims, 9 Drawing Sheets

(56) References Cited

U.S. PATENT DOCUMENTS

| | | |
|---|---|---|
| 2017/0286830 A1 | 10/2017 | El-Yaniv et al. |
| 2018/0039886 A1 | 2/2018 | Umuroglu et al. |
| 2018/0107925 A1 | 4/2018 | Choi et al. |
| 2018/0158520 A1* | 6/2018 | Shu .................. G11C 15/04 |
| 2018/0315473 A1 | 11/2018 | Yu et al. |

OTHER PUBLICATIONS

Biswas et al., "Cony-RAM: An Energy-Efficient SRAM with Embedded Convolution Computation for Low-Power CNN-Based Machine Learning Applications," IEEE International Solid-State Circuits Conference, 2018, pp. 488-497.

Khwa et al., "A 65nm 4Kb Algorithm-Dependent Computing-in-Memory SRAM Unit-Macro with 2.3ns and 55.8TOPS/W Fully Parallel Product-Sum Operation for Binary DNN Edge Processors," IEEE International Solid-State Circuits Conference, pp. 496-497.

Jiang et al., "XNOR-SRAM: In-Memory Computing SRAM Macro for Binary/Ternary Deep Neural Networks," IEEE Symposium on VLSI Technology, 2018, pp. 1-2.

Zhang et al., "A Machine-Learning Classifier Implemented in a Standard 6T SRAM Array," IEEE Symposium on VLSI Circuits (VLSI—Circuits), 2016, pp. 1-2.

Agrawal et al., "Xcel-RAM: Accelerating Binary Neural Networks in High-Throughput SRAM Compute Arrays," ArXiv:1807.00343v2, 2018, pp. 1-10.

Conti et al., "XNOR Neural Engine: A Hardware Accelerator IP for 21.6 fJ/op Binary Neural Network Inference," IEEE Transactions on Computer-Aided Design of Integrated Circuits and Systems, 2018, pp. 1-11.

Corbariaux et al., "Binarized Neural Networks: Training Neural Networks with Weights and Activations Constrained to +1 or −1," ArXiv:1602.02830v3, 2016, pp. 1-11.

Anonymous Authors, "Discovering Low-Precision Networks Close to Full-Precision Networks for Efficient Embedded Inference," ICLR, 2019, pp. 1-11.

Jia et al., "A Microprocessor Implemented in 65nm CMOS with Configurable and Bit-Scalable Accelerator for Programmable In-memory Computing," ArXiv:1811.04047, 2018, pp. 1-10.

Kim et al., "Bitwise Neural Networks," ArXiv:1601.06071v1, 2016, pp. 1-5.

Li et al., "Build a Compact Binary Neural Network through Bit-level Sensitivity and Data Pruning," ArXiv:1802.00904, 2018, pp. 1-7.

Lin et al., "Towards Accurate Binary Convolutional Neural Network," ArXiv:1711.11294v1, 2017, pp. 1-14.

Gonugondla et al., "A 42pJ/Decision 3.12TOPS/W Robust In-Memory Machine Learning Classifier with On-Chip Training," IEEE International Solid-State Circuits Conference, 2018, pp. 490-491.

Wu et al., "Brain-Inspired Computing Exploiting Carbon Nanotube FETs and Resistive Ram: Hyperdimensional computing Case Study," IEEE International Solid-State Circuits Conference, 2018, pp. 492-494.

Chen et al., "A 65nm 1Mb Nonvolatile Computing-in-Memory ReRAM Macro with Sub-16ns Multiply-and-Accumulate for Binary DNN AI Edge Processors," IEEE International Solid-State Circuits Conference, 2018, 494-496.

Rastegari et al., "XNOR-Net: ImageNet Classification Using Binary Convolutional Neural Networks," ArXiv:1603.05279, 2016, pp. 1-17.

Rusci et al., "Design Automation for Binarized Neural Networks: A Quantum Leap Opportunity?" ArXiv:1712.01743v1, 2017, pp. 1-5.

Tang et al., "How to Train a Compact Binary Neural Network with High Accuracy?" Proceedings of the Thirty-First AAAI Conference on Artificial Intelligence, 2017, pp. 2625-2631.

Zhou et al., "DoReFa-Net: Training Low Bitwidth Convolutional Neural Networks with Low Bitwidth Gradients," ArXiv:1606.06160v3, 2018, pp. 1-13.

Zhuang et al., "Rethinking Binary Neural Network for Accurate Image Classification and Semantic Segmentation," ArXiv:1811.10413v1, 2018, pp. 1-12.

\* cited by examiner

XNOR Truth Table

| A | B | Output |
|---|---|--------|
| 0 | 0 | 1 |
| 0 | 1 | 0 |
| 1 | 0 | 0 |
| 1 | 1 | 1 |

FIG. 2

XNOR Truth Table For 3P-SRAM Cell Of Figure 1

| RWL_AS1 On RWL1 | RWL_AS2 on RWL2 | Logic State Of Stored Bit At Node NT | $V_{CRBL}$ |
|---|---|---|---|
| A | $\overline{A}$ | B | Read Result |
| 0 | 1 | 0 | ↓ |
| 0 | 1 | 1 | - |
| 1 | 0 | 0 | - |
| 1 | 0 | 1 | ↓ |

FIG. 3

THREE-PORT MEMORY CELL AND ARRAY FOR IN-MEMORY COMPUTING

BACKGROUND

Field of the Invention

The present invention relates to in-memory computing and, more particularly, to a memory cell structure and a memory array configured for in-memory computing.

Description of Related Art

Current state-of-the-art image and voice processing techniques employ convolutional neural networks (CNNs) for recognition and classification. A CNN is a deep learning algorithm and approximately 90% of the computations performed in the algorithm are multiply and accumulate (MAC) operations. In a CNN for image processing, the various MAC operations are used to compute the products of inputs (also referred to as activations), which are identified intensity values of the pixels in a receptive field, and weights in a convolution filter matrix (also referred to as a kernel) of the same size as the receptive field, and to further compute the sum of the products. Historically, the input and weight values used in CNNs were real numbers and software solutions were employed. Hardware-implemented CNNs were subsequently developed to increase processing speed. Recently, binary neural networks (BNNs) have been developed. A BNN is essentially a CNN where binary input and/or weight values are used. In one exemplary hardware-implemented BNN (referred to as an XNOR-NET BNN), real input and weight values are converted to binary input and weight values and the MAC computations are accomplished through hardware architectures configured to perform XNOR-bitcount-compare functions (also referred to as XNOR-popcount-compare functions). Hardware-implemented XNOR-NET BNNs offer large memory and computation savings without sacrificing much in terms of accuracy. It would, however, be advantageous to provide a modified configuration for a hardware-implemented XNOR-NET BNN designed to further improve performance, scalability, and/or manufacturability.

SUMMARY

In view of the foregoing, disclosed herein are embodiments of a three-port static random access memory (3P-SRAM) cell configured to perform XNOR operations. Specifically, the disclosed 3P-SRAM cell includes a write port and two read ports (i.e., a first read port and a second read port). In this 3P-SRAM cell, the read ports share a common read bitline and read operations are enabled using either a first read wordline and the common read bitline or a second read wordline and the common read bitline. Activation of the first and second read wordlines is selectively controlled such that only one of the two read wordlines is activated (i.e., receives a read pulse) at a time. As a result, a read operation performed through either read port effectively accomplishes an XNOR operation. Also disclosed herein are embodiments of a memory array, which incorporates such 3P-SRAM cells and which is specifically configured to perform XNOR-bitcount-compare functions. Since, as discussed above, XNOR-bitcount-compare functions are used in XNOR-NET type binary neural networks (BNNs), the disclosed memory array can be employed for implementing an XNOR-NET BNN designed for improved performance, scalability, and manufacturability. Also disclosed herein are embodiments of an in-memory computing method that employs the above-described memory cells and memory array.

More particularly, disclosed herein are embodiments of 3P-SRAM cell having a write port and a pair of read ports (i.e., a first read port and a second read port). The 3P-SRAM cell can include a true storage node that stores a true bit and a complement storage node that stores a complement bit (i.e., that stores the complement of the true bit). For the first read port, the 3P-SRAM cell can have a first read pass-gate transistor and a first read pull-down transistor connected in series between a common read bitline and a first voltage rail (e.g., a ground or negative voltage rail). The gates of the first read pass-gate transistor and the first read pull-down transistor can be connected to a first read wordline and to the true storage node, respectively. For the second read port, the 3P-SRAM cell can have a second read pass-gate transistor and a second read pull-down transistor connected in series between the common read bitline and the first voltage rail. The gates of the second read pass-gate transistor and the second read pull-down transistor can be connected to a second read wordline and to the complement storage node, respectively.

With the above-described configuration, a read operation initiated through either the first read port or the second read port can be used to effectively accomplish an XNOR operation. Specifically, during a read operation, the common read bitline and a capacitor connected thereto can be pre-charged and a read pulse can be applied selectively and exclusively to only one of the two read wordlines. That is, a read pulse can be applied to either the first read wordline for a read operation through the first read port or to the second read wordline for a read operation through the second read port, but not both. It should be understood that a read pulse refers to a pulse of a sufficiently high positive voltage to represent a high logic state (i.e., a logic value of "1") on the read wordline during the duration of the pulse. When a read pulse is applied to only one of the two read wordlines, the other of the two read wordlines has a low logic state (i.e., a logic value of "0"). During the read pulse, a first digital input for the XNOR operation will be the logic state of the first read wordline, a second digital input for the XNOR operation will be the logic state of the true bit and the output of the XNOR operation is determinable based on whether the voltage level on the common read bitline discharges through the 3P-SRAM cell or not.

Also disclosed herein are embodiments of a memory array that incorporates such 3P-SRAM cells. Specifically, the embodiments of the memory array can include 3P-SRAM cells arranged in columns and row. For each column, the memory array can include a common read bitline connected to all of the 3P-SRAM cells in the column, a voltage comparator connected to the common read bitline, and a capacitor also connected to the common read bitline. For scalability, each capacitor can be a back end of the line (BEOL) capacitor formed within one or more of the BEOL metal levels and positioned above the memory cells such that incorporation of the capacitors does not increase the chip surface area consumed by the memory array. Additionally, for each row, the memory array can include a pair of read wordlines (i.e., a first read wordline and a second read wordline) connected to all of the memory cells in the row.

As discussed above, each 3P-SRAM cell can be configured so as to have a write port and a pair of read ports (i.e., a first read port and a second read port). Each 3P-SRAM cell can include a true storage node that stores a true bit and a complement storage node that stores a complement bit (i.e., the complement of the true bit). For the first read port, each 3P-SRAM cell can include a first read pass-gate transistor and a first read pull-down transistor connected in series between the common read bitline for the specific column and a first voltage rail (e.g., a ground or negative voltage rail). The gates of the first read pass-gate transistor and the first read pull-down transistor can be connected to a first read wordline for a specific row and to the true storage node, respectively. For the second read port, each 3P-SRAM cell can include a second read pass-gate transistor and a second read pull-down transistor connected in series between the common read bitline for the specific column and the first voltage rail. The gates of the second read pass-gate transistor and the second read pull-down transistor can be connected to a second read wordline for the specific row and to the complement storage node, respectively.

With the above-described configuration, concurrent read operations of the 3P-SRAM cells in any selected column can be used to accomplish an XNOR-bitcount-compare function.

Specifically, the memory array can include bitline drivers and wordline drivers. During concurrent read operations and, thereby during concurrent XNOR operations in all of the 3P-SRAM cells in a selected column, a bitline driver can pre-charge the common read bitline for the selected column and thereby the capacitor connected thereto and the wordline drivers can selectively and exclusively apply read pulses to only one of the first read wordline and the second read wordline in each of the rows. As mentioned above, a read pulse refers to a pulse of a on the read wordline positive voltage to represent a high logic state (i.e., a logic value of "1") during the duration of the pulse. When a read pulse is applied to only one of the two read wordlines in each of the rows, the other of the two read wordlines will have a low logic state (i.e., a logic value of "0"). At the end of the concurrent XNOR operations and, particularly, following concurrent application of the read pulse to the selected read wordline in each row (i.e., when the selected read wordline in each row is returned to a low voltage state), the voltage comparator of the selected column can perform a compare operation to compare an actual voltage level on the common read bitline for the selected column to a reference voltage level and can output a digital output indicating whether the actual voltage level is below the reference voltage level or not. It should be noted that the actual voltage level ($V_{CRBL}$) on the common read bitline at the end of the concurrent XNOR operations will be indicative of how many of the 3P-SRAM cells in the selected column enabled discharging of the voltage level on the common read bitline. Thus, the actual voltage will be indicative of a bitcount of the results of the concurrent XNOR operations. Furthermore, the reference voltage level ($V_{ref}$) can be predetermined so that it corresponds to a bitcount threshold (e.g., so that it is approximately equal to the expected voltage level on the common read bitline if one-half of the memory cells enable discharging of the common read bitline). Thus, the digital output of the voltage comparator for the selected column will indicate whether or not the actual bitcount is below the bitcount threshold. In other words, the digital output from the voltage comparator of a selected column following the concurrent XNOR operations performed therein is effectively a final result of an XNOR-bitcount-compare function.

As discussed further in the detailed description section below, multiple XNOR-bitcount-compare functions may be performed in parallel and, particularly, during the same clock cycle, in the different columns, respectively, when the first inputs, which are to be applied to the first read wordlines of the rows are the same for all the XNOR-bitcount-compare functions and when only the second inputs, which are stored in the 3P-SRAM cells vary from column to column. It should be noted that, since XNOR-bitcount-compare functions are used in XNOR-NET type binary neural networks (BNNs), the disclosed memory array can be employed for implementing an XNOR-NET BNN designed for improved performance, scalability, and manufacturability.

Also disclosed herein are embodiments of an in-memory computing method that employs 3P-SRAM cells in a memory array. Specifically, an embodiment of an in-memory computing method can include providing a memory array, as described above, with 3P-SRAM cells, also as described above. The method can include pre-charging the common read bitline and thereby the capacitor of a selected column and selectively and exclusively applying a read pulse to only one of the first read wordline and the second read wordline in each of the rows (i.e., to either the first read wordline or the second read wordline, but not both so that concurrent XNOR operations are performed by all memory cells in the selected column. It should be understood that a read pulse refers to a pulse of a sufficiently high positive voltage to represent a high logic state (i.e., a logic value of "1") on the read wordline during the duration of the pulse. When a read pulse is applied to only one of the two read wordlines, the other of the two read wordlines will have a low logic state (i.e., a logic value of "0").

The method can further include performing a comparison of an actual voltage level ($V_{CRBL}$) on the common read bitline of the column at the end of the concurrent XNOR operations to a reference voltage level ($V_{ref}$) and outputting a digital output based on the results of the comparison. As discussed above, the actual voltage level ($V_{CRBL}$) that is on the common read bitline of the selected column at the end of the concurrent XNOR operations and, particularly, that is on the common read bitline of the selected column following concurrent application of the read pulse to the selected read wordline in each row (i.e., when the selected read wordline in each row is returned to a low voltage state) will be indicative of how many of the 3P-SRAM cells in the selected column enabled discharging of the voltage level on the common read bitline. Thus, the actual voltage level ($V_{CRBL}$) will be indicative of a bitcount of the results of the concurrent XNOR operations. Furthermore, the reference voltage level ($V_{ref}$) can be predetermined so that it corresponds to a bitcount threshold (e.g., so that it is approximately equal to the expected voltage level on the common read bitline if one-half of the memory cells enable discharging of the common read bitline). Thus, the digital output will indicate whether or not the actual bitcount is below the bitcount threshold. In other words, the digital output following the concurrent XNOR operations in a selected column is effectively a final result of an XNOR-bitcount-compare function.

As discussed further in the detailed description section below, multiple XNOR-bitcount-compare functions may be performed in parallel and, particularly, during the same clock cycle, in the different columns, respectively, when the first inputs, which are to be applied to the first read wordlines of the rows are the same for all the XNOR-bitcount-compare functions and when only the second inputs, which are stored in the 3P-SRAM cells at the true storage node vary from column to column. Furthermore, since XNOR-bitcount-compare functions are used in XNOR-NET type binary neural networks (BNNs), the disclosed in-memory computing method can be employed for implementing an XNOR-NET BNN designed for improved performance, scalability, and manufacturability.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 2 shows a truth table for a conventional XNOR gate;

FIG. 3 shows a truth table for XNOR operations performed using the 3P-SRAM cell of FIG. 1;

DETAILED DESCRIPTION

As mentioned above, a binary neural network (BNN) is essentially a convolutional neural network (CNN) that uses binary input and/or weight values to accomplish the multiply and accumulate (MAC) operations. In one exemplary hardware-implemented BNN (referred to as an XNOR-NET BNN), real input and weight values are converted to binary input and weight values and the MAC computations are accomplished through hardware architectures configured to perform XNOR-bitcount-compare functions (also referred to as XNOR-popcount-compare functions). Hardware-implemented XNOR-NET BNNs offer large memory and computation savings without sacrificing much in terms of accuracy. It would, however, be advantageous to provide a modified configuration for a hardware-implemented XNOR-NET BNN designed to further improve performance, scalability, and/or manufacturability.

In view of the foregoing, disclosed herein are embodiments of a three-port static random access memory (3P-SRAM) cell configured to perform XNOR operations. Specifically, the disclosed 3P-SRAM cell includes a write port and two read ports (i.e., a first read port and a second read port). In this 3P-SRAM cell, the read ports share a common read bitline and read operations are enabled using either a first read wordline and the common read bitline or a second read wordline and the common read bitline. Activation of the first and second read wordlines is selectively controlled such that only one of the two read wordlines is activated (i.e., receives a read pulse) at a time. As a result, a read operation performed through either read port effectively accomplishes an XNOR operation. Also disclosed herein are embodiments of a memory array, which incorporates such 3P-SRAM cells and which is specifically configured to perform XNOR-bitcount-compare functions. Since, as discussed above, XNOR-bitcount-compare functions are used in XNOR-NET type binary neural networks (BNNs), the disclosed memory array can be employed for implementing an XNOR-NET BNN designed for improved performance, scalability, and manufacturability. Also disclosed herein are embodiments of an in-memory computing method that employs the above-described memory cells and memory array.

Figure 1:
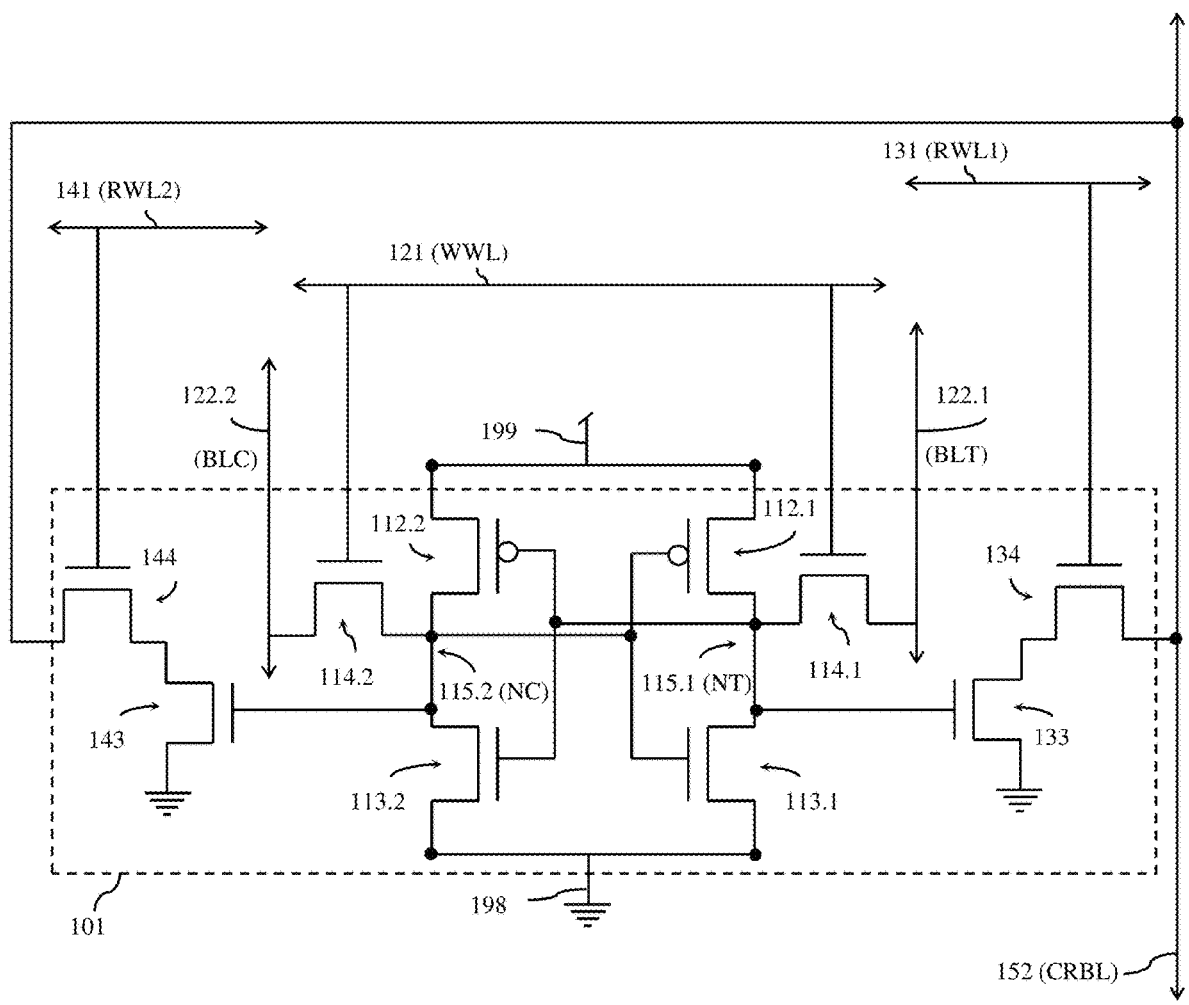
FIG. 1 is a schematic diagram illustrating an embodiment of a three-port static random access memory (3P-SRAM) cell.

More particularly, referring to FIG. 1, disclosed herein are embodiments of a three-port static random access memory (3P-SRAM) cell 101 with one write port and a pair of read ports (i.e., a first read port and a second read port).

Specifically, the 3P-SRAM cell 101 can include a pair of cross-coupled inverters connected between a first voltage rail 198 (e.g., a ground rail or negative voltage rail, $V_{ss}$) and a second voltage rail 199 (e.g., a positive voltage rail, $V_{cs}$ or $V_{dd}$). The cross-coupled inverters can include a first inverter and a second inverter. The first inverter can include a pull-down transistor 113.1 and a pull-up transistor 112.1 electrically connected in series between the first voltage rail 198 and the second voltage rail 199. The first inverter can further include a true storage node 115.1 (NT) at the junction between the drain of the pull-down transistor 113.1 and the drain of the pull-up transistor 112.1. The second inverter can include a pull-down transistor 113.2 and a pull-up transistor 112.2 electrically connected in series between the first voltage rail 198 and the second voltage rail 199. The second inverter can further include a complement storage node 115.2 (NC) at the junction between the drain of the pull-down transistor 113.2 and the drain of the pull-up transistor 112.2. The gates of the pull-down transistor 113.1 and the pull-up transistor 112.1 of the first inverter can be electrically connected to the complement storage node 115.2 and the gates of the pull-down transistor 113.2 and the pull-up transistor 112.2 of the second inverter can be electrically connected to the true storage node 115.1 such that the first inverter and the second inverter are cross-coupled.

The 3P-SRAM cell 101 can further include a first read pass-gate transistor 134 and a first read pull-down transistor 133 for the first read port, a second read pass-gate transistor 144 and a second read pull-down transistor 143 for the second read port and a pair of additional pass-gate transistors (i.e., a first additional pass-gate transistor 114.1 and a second additional pass-gate transistor 114.2) for the write port. Thus, the 3P-SRAM cell 101 is a ten-transistor (10T) SRAM cell. It should be noted that the write port could alternatively be a read/write port depending upon the peripheral circuitry of a memory array that incorporates the 3P-SRAM cell.

In any case, the first read pass-gate transistor 134 and the first read pull-down transistor 133 can be electrically connected in series between a common read bitline 152 (CRBL) (i.e., a read bitline that is shared by both the first read port and the second read port) and the first voltage rail 198. The gate of the first read pass-gate transistor 134 can be electrically connected to a first read wordline 131 (RWL1) for the first read port and the gate of the first read pull-down transistor 133 can be electrically connected to the true storage node 115.1. The second read pass-gate transistor 144 and the second read pull-down transistor 143 can also be electrically connected in series between the common read bitline 152 and the first voltage rail 198. The gate of the second read pass-gate transistor 144 can be electrically connected to a second read wordline 141 (RWL2) for the second read port and the gate of the second read pull-down transistor 143 can be electrically connected to the complement storage node 115.2.

The first additional pass-gate transistor 114.1 can be electrically connected between the true storage node 115.1 and a true bitline 122.1 (BLT) of a pair of complementary bitlines for the write port. That is, the source of the first additional pass-gate transistor 114.1 can be electrically connected to the true storage node 115.1 and the drain of the first additional pass-gate transistor 114.1 can be electrically connected to the true bitline 122.1. The second additional pass-gate transistor 114.2 can be electrically connected between the complement storage node 115.2 and a complement bitline 122.2 (BLC) of the pair of complementary bitlines for the write port. That is, the source of the second additional pass-gate transistor 114.2 can be electrically connected to the complement storage node 115.2 and the drain of the second additional pass-gate transistor 114.2 can be electrically connected to the complement bitline 122.2. The gates of the first additional pass-gate transistor 114.1 and the second additional pass-gate transistor 114.2 can both be electrically connected to the same write wordline 121 (WWL) for the write port.

Those skilled in the art will recognize that the various pass-gate and pull-down transistors of the 3P-SRAM cell 101 can be n-type field effect transistors (NFETs). Additionally, the various pull-up transistors of the 3P-SRAM cell 101 can p-type field effect transistors (PFETs).

The 3P-SRAM cell 101 can have three different modes of operation: standby, write through the write port or read through a selected one of the two read ports.

In the standby mode, the 3P-SRAM cell 101 is idle.

In the write mode, a true bit is written into the true storage node 115.1 and, as a result, a complement bit with an opposite logic value than the true bit is written into the complement storage node 115.2. That is, if a true bit with a binary data value of "1" (also referred to herein as a high data value, a high logic state, a logic value of "1", a logic "1", etc.) is written to the true storage node 115.1, then a complement bit with a binary data value of "0" (also referred to herein as a low data value, a low logic state, a logic value of "0", a logic "0", etc.) will be concurrently written to the complement storage node 115.2 and vice versa. In order to write a binary data value of "1" to the true storage node 115.1 and, thereby a binary data value of "0" to the complement storage node 115.2, a high voltage level can be applied to the true bitline 122.1 (e.g., by a bitline driver) and a low voltage level can be applied to the complement bitline 122.2 (e.g., the complement bitline 122.2 can be discharged to ground). The write wordline 121 can then be activated, thereby turning on the first additional pass-gate transistor 114.1 and the second additional pass-gate transistor 114.2 and storing the binary data value of "1" in the true storage node 115.1 and the binary data value of "0" in the complement storage node 115.2. Contrarily, in order to write a binary data value of "0" into the true storage node 115.1 and a binary data value of "1" into the complement storage node 115.2, the low voltage level can be applied to the true bitline 122.1 (e.g., the true bitline 122.1 can be discharged to ground) and the high voltage level can be applied to the complement bitline 122.2 (e.g., by a bitline driver). Then, the write wordline 121 can be activated (e.g., by a wordline driver), thereby turning on both the first additional pass-gate transistor 114.1 and the second additional pass-gate transistor 114.2 and storing the binary data value of "0" in the true storage node 115.1 and the binary data value of "1" in the complement storage node 115.2. In the above-described write operations, the write wordline 121 is activated when a write pulse is applied to the write wordline 121 and, particularly, when the voltage level of a write wordline activation signal on the write wordline 121 is switched from a low voltage level, which represents a low logic state (i.e., a logic "0"), to a higher positive voltage level, which is sufficiently high to represent a high logic state (i.e., a logic "1") for a period of time (i.e., the pulse width) so that any pass-gate transistor having a gate electrically connected to that write wordline 121 (WWL) will be turned on during that period of time.

In the read mode, a read operation initiated through one read port or the other (but not both) can be used to accomplish an in-memory XNOR operation (also referred to herein as an XNOR function or an exclusive NOR operation) because the 3P-SRAM cell 101 has two different read ports that can be accessed through two different read wordlines 131 and 141 but that share a common read bitline 152 and because of the true bit stored at the true storage node 115.1 and the complement bit stored at the complement storage node 115.2.

Specifically, FIG. 2 shows a truth table for a conventional XNOR gate. This table indicates the possible combinations for digital inputs A and B and the resulting digital output. As illustrated, when A and B have the same logic states (i.e., both logic "0" or both logic "1"), the digital output of the XNOR gate will be a logic "1". Contrarily, when A and B have different logic states (i.e., when A is a logic "1" and B is a logic "0" or vice versa), then the digital output of the XNOR gate will be a logic "0".

For the 3P-SRAM cell 101, essentially the same truth table will hold true if the logic states of the first read wordline 141 and the true bit stored at the true storage node 115.1 are considered the first digital input A and the second digital input B, respectively, following activation of either the first read wordline 131 for a read operation initiated through the first read port or the second read wordline 141 for a read operation initiated through the second read port (but not both).

For example, referring to FIG. 1 in combination with the truth table of FIG. 3, during a read operation to accomplish an in-memory XNOR operation, the common read bitline 152 connected to the 3P-SRAM cell 101 can be pre-charged (e.g., by a bitline driver). Then, read wordline activation can be selectively controlled (e.g., by a memory controller) such that a read pulse is applied selectively and exclusively (e.g., by a wordline driver) to only one of the two read wordlines at a time (i.e., so that the read pulse is applied to either the first read wordline 131 or the second read wordline 141, but not both). Specifically, each read wordline connected to the 3P-SRAM cell 101 can receive a corresponding read wordline activation signal. To accomplish the in-memory XNOR operation, one of the two read wordlines can be activated by applying a read pulse to that read wordline through the read wordline activation signal. That is, the voltage level of the read wordline activation signal to one of the read wordlines can be switched from a low voltage level, which represents a low logic state (i.e., a logic "0"), to a higher positive voltage level, which is sufficiently high to represent a high logic state (i.e., a logic "1") for a period of time (i.e., a pulse width). Thus, during the duration of the read pulse, the activated read wordline (i.e., the read wordline that receives the read pulse) will have a high logic state (i.e., a logic "1") such that the pass gate transistor with its gate connected to that read wordline will turn on. The other read wordline (i.e., the read wordline that does not receive the read pulse) will have a low logic state (i.e., a logic "0") and the pass gate transistor with its gate connected to that read wordline will not turn on.

FIG. 3 shows a truth table for an XNOR operation accomplished through a read operation in the 3P-SRAM cell 101. This truth table indicates the possible combinations for the digital input A and the digital input B and the read result (i.e., the output). As mentioned above, during a read operation of the 3P-SRAM cell 101 to accomplish an XNOR operation, the logic state of the first read wordline 141 connected to that 3P-SRAM cell 101 will be the first digital input A and the logic state of the true bit stored on the true storage node 115.1 will be the second digital input B. Those skilled in the art will recognize that a read operation will only occur (and, thus, an XNOR operation will only occur) when the first read wordline 131 or the second read wordline 141 is activated.

When a read pulse is applied through a first read wordline activation signal (RWL_AS1) to the first read wordline 131 in order to initiate a read operation through the first read port, no read pulse will be applied through a second read wordline activation signal (RWL_AS2) to the second read wordline 141. Thus, the logic state of the first read wordline 131 will be a logic "1" and the logic state of the second read wordline 141 will be a logic "0". Alternatively, when a read pulse is applied through RWL_AS2 to the second read wordline 141 in order to initiate a read operation through the second port, no read pulse will be applied through RWL_AS1 to the first read wordline 131. Thus, the logic state of the first read wordline 131 will be a logic "0" and the logic state of the second read wordline 141 will be a logic "1". The result of a read operation through either the first read port or the second read port will be either: (a) the voltage level ($V_{CRBL}$) on the common read bitline 152 is discharged through the 3P-SRAM cell 101 (i.e., $V_{CRBL}$ drops), as indicated by the down arrow; or (b) the voltage level ($V_{CRBL}$) on the common read bitline 152 is not discharged through the 3P-SRAM cell 101, as indicated by the dash.

It should be noted that the pulse width of the read pulse (i.e., the period of time during which the higher positive voltage level is applied to a read wordline) as well as the pulse amplitude (i.e., the actual voltage level) can be predetermined and finely tuned so that, if/when the voltage level ($V_{CRBL}$) on the common read bitline 152 is discharged through the 3P-SRAM cell 101 (i.e., $V_{CRBL}$ drops), it can be registered (i.e., sensed by the particular sensing device employed). See also the detailed discussion below with regard to the memory array embodiments, which are configured to allow concurrent read operations (i.e., concurrent XNOR operations) of all 3P-SRAM cells in the same column to be performed and wherein a capacitor, a tunable pulse width and a tunable pulse amplitude are employed to discriminate when the voltage level ($V_{CRBL}$) on the common read bitline 152 is discharged through some number (e.g., half) of the 3P-SRAM cells in the column.

During a read operation through the first read port, the first read wordline 131 has the higher positive voltage level (i.e., when A is a logic "1") so that the first read pass-gate transistor 134 is on and the second read wordline 141 has a low voltage level (i.e., a logic state of "0") so that the second read pass-gate transistor 144 is off. When the true bit stored on the true storage node 115.1 is a logic "0" (i.e., when B is a logic "0") and, thus, the complement bit stored on the complement storage node 115.2 is a logic "1", the first read pull-down transistor 133 will be off and the second read pull-down transistor 143 will be on. In this case, even though the first read pass-gate transistor 134 is on, the voltage level ($V_{CRBL}$) on the common read bitline 152 will not discharge through the first side of the 3P-SRAM cell 101 because the first read pull-down transistor 133 is off. Furthermore, even though the second read pull-down transistor 143 is on, the voltage level ($V_{CRBL}$) on the common read bitline 152 will not discharge through the second side of the 3P-SRAM cell 101 because the second read pass-gate transistor 144 is off. Thus, when A is a logic "1" and B is a logic "0", an XNOR operation output of logic "0" is indicated. Alternatively, when the true bit stored on the true storage node 115.1 is a logic "1" (i.e., when B is a logic "1") and, thus, the complement bit stored on the complement storage node 115.2 is a logic "0", the first read pull-down transistor 133 will be on and the second read pull-down transistor 143 will be off. In this case, because both the second read pass-gate transistor 144 and the second read pull-down transistor 143 are off, the voltage level ($V_{CRBL}$) on the common read bitline 152 will not discharge through the second side of the 3P-SRAM cell 101. However, because both the first read pass-gate transistor 134 and the first read pull-down transistor 133 are on, the voltage level ($V_{CRBL}$) on the common read bitline 152 will discharge through the first side of the 3P-SRAM cell 101. Thus, when A is a logic "1" and B is also a logic "1", an XNOR operation output of logic "1" is indicated.

During a read operation through the second read port, the first read wordline 131 has a low voltage level (i.e., A is a logic "0") so that the first read pass-gate transistor 134 is off and the second read wordline 141 has the higher positive voltage level (i.e., a logic state of "1") so that the second read pass-gate transistor 144 is on. When the true bit stored on the true storage node 115.1 is a logic "0" (i.e., when B is a logic "0") and, thus, the complement bit stored on the complement storage node 115.2 is a logic "1", the first read pull-down transistor 133 will be off and the second read pull-down transistor 143 will be on. In this case, because both the first read pass-gate transistor 134 and the first read pull-down transistor 133 are off, the voltage level ($V_{CRBL}$) on the common read bitline 152 will not discharge through the first side of the 3P-SRAM cell 101. However, because both the second read pass-gate transistor 144 and the second read pull-down transistor 143 are on, the voltage level ($V_{CRBL}$) on the common read bitline 152 will discharge through the second side of the 3P-SRAM cell 101. Thus, when A is a logic "0" and B is a logic "0", an XNOR operation output of logic "1" is indicated. Alternatively, when the true bit stored on the true storage node 115.1 is a logic "1" (i.e., when B is a logic "1") and, thus, the complement bit stored on the complement storage node 115.2 is a logic "0", the first read pull-down transistor 133 will be on and the second read pull-down transistor 143 will be off. In this case, even though the second read pass-gate transistor 144 is on, the voltage level ($V_{CRBL}$) on the common read bitline 152 will not discharge through the second side of the 3P-SRAM cell 101 because the second read pull-down transistor 143 is off. Furthermore, even though the first read pull-down transistor 133 is on, the voltage level ($V_{CRBL}$) on the common read bitline 152 will not discharge through the first side of the 3P-SRAM cell 101 because the first read pass-gate transistor 134 is off. Thus, when A is a logic "0" and B is a logic "1", an XNOR operation output of logic "0" is indicated.

Multiple 3P-SRAM cells 101, as described above, could be incorporated into a memory array with one-input devices (e.g., inverters, skewed logic gates, etc.) connected to the ends of the common read bitlines for the columns, respectively. Such a single-input device could be used for large signal sensing of the XNOR output from a selected 3P-SRAM cell (i.e., a 3P-SRAM cell in a given column and row).

Alternatively, multiple 3P-SRAM cells 101, as described above, could be incorporated into a memory array with two-input devices (e.g., op-amp voltage comparators etc.) connected to the ends of the common read bitlines for the columns, respectively. Such a two-input device could be used to compare the actual voltage level on a common read bitline of a column to a reference voltage for small signal sensing of the XNOR output from a selected 3P-SRAM cell (i.e., a 3P-SRAM cell in a given column and row).

Alternatively, multiple 3P-SRAM cells 101, as described above, could be incorporated into a memory array specifically configured for in-memory computing of XNOR-bitcount-compare functions, as described below. More specifically, referring to FIG. 4, also disclosed herein are embodiments of a memory array 400 that includes multiple 3P-SRAM cells 101, as described in detail above and illustrated in FIG. 1. The 3P-SRAM cells 101 can be formed in an active device layer on a semiconductor substrate of an integrated circuit (IC) chip. The 3P-SRAM cells 101 can further be arranged in columns A, B, . . . m, which are specifically configured for in memory computing of XNOR-bitcount-compare functions, and rows 1, 2, 3, . . . n. For purposes of illustration, the rows are oriented in the X direction and the columns are oriented in the Y direction. However, it should be understood that the drawings are not intended to be limiting and that, alternatively, the rows could be oriented in the Y direction and the columns could be oriented in the X direction.

Each column can include a pair of complementary bitlines (see true and complementary bitlines 122.1A-122.2A, 122.1B-122.2B, . . . 122.1m-122.2m). For a given column, the true bitline can be electrically connected to all the 3P-SRAM cells 101 in that column at the drain of the pass-gate transistor 114.1 on the first side (e.g., the right-hand side) and the complement bitline can be electrically connected to all the 3P-SRAM cell 101 in that column at the drain of the pass-gate transistor 114.2 on the second side (e.g., the left-hand side). Each column can also include a single common read bitline (see common read bitlines 152A, 152B, . . . 152m). For a given column, the common read bitline can be electrically connected to all the 3P-SRAM cells 101 in that column at the drains of both the first read pass-gate transistor 134 on the first side and the second read pass-gate transistor 144 on the second side. Each column can also be electrically connected to both a voltage comparator and a capacitor (see the voltage comparator 401A and capacitors 402A for column A, the voltage comparator 401B and capacitor 402B for column B, . . . and the voltage comparator 401m and the capacitor 402m for column m). Each voltage comparator for each column can be, for example, an op-am voltage comparator formed within the active device layer and configured to compare an actual voltage level ($V_{CRBL}$) at one end of the common read bitline for the column to a reference voltage ($V_{ref}$), discussed in greater detail below, and to output a digital output (Q) indicating whether $V_{CRBL}$ is less than $V_{ref}$ or not. Voltage comparators are well known in the art and, thus, the details thereof have been omitted from this specification in order to allow the reader to focus on the salient aspects of the disclosed embodiments. Each capacitor for each column can include a first conductive plate electrically connected to a node on the common read bitline for the column, a second conductive plate electrically connected to the first voltage rail 498 (e.g., a ground or negative voltage rail), and a dielectric layer between and in contact with the first conductive plate and the second conductive plate.

Each row can include a write wordline (WWL) (see WWL $121_1$ for row 1, WWL $121_2$ for row 2, WWL $121_3$ for row 3, . . . and WWL $121_n$ for row n). For each row, the write wordline can be connected to all the 3P-SRAM cells 101 in the row at the gates of the pass-gate transistors 114.1 and 114.2. Each row can further include a first read wordline (RWL1) (see RWL1 $131_1$ of row 1, RWL1 $131_2$ of row 2, RWL1 $131_3$ of row 3, . . . and RWL1 $131_n$ of row n) and a second read wordline (RWL2) (see RWL2 $141i$ of row 1, RWL2 $141_2$ of row 2, RWL2 $141_3$ of row 3, . . . and RWL2 $141_n$ of row n). For each row, the first read wordline (RWL1) can be connected to all the 3P-SRAM cells 101 in the row at the gate of the first read pass-gate transistor 134 and the second read wordline (RWL2) can be connected to all the 3P-SRAM cells 101 in the row at the gate of the second read pass-gate transistor 144.

The above-described wordlines and bitlines can, for example, be formed in the back end of the line (BEOL) metal levels of the IC chip above the active device layer. BEOL and MOL interconnects (e.g., vias, wires, contacts, metal plugs, etc.) can be employed to electrically connect the wordlines and bitlines to the memory cells as described above. Optionally, the capacitor for each column can also be formed in one or more of the BEOL metal levels (e.g., as metal-on-metal (MOM) capacitors) and electrically connected to the corresponding common read bitline by BEOL interconnects (e.g., vias and/or wires). Furthermore, these MOM capacitors can be located in a region of the BEOL metal levels aligned above the memory cells such that incorporating them into the memory array does not result in an increase in chip surface area consumption.

The memory array 400 can further include a memory controller 495 and peripheral circuitry 491-492. In response to control signals (e.g., row address and column address signals for selecting SRAM cells and read, write or standby signals for indicating the operations to be performed with respect to the selected SRAM cells) from the memory controller 495, the peripheral circuitry 491-492 can enable write operations (i.e., selectively writing data values to the true storage node of each of the 3P-SRAM cells 101) and also read operations (as described in greater detail below). Peripheral circuitry 491 connected to the rows (at one end or at a combination of both ends) can include, for example, address decode logic and wordline drivers for selectively activating any of the wordlines during write or read operations. Peripheral circuitry 492 connected to the columns (at one end or at a combination of both ends) can include column address decode logic and bitline drivers for appropriately biasing selected bitlines during write or read operations. Controllers and other circuitry used in memory arrays to write data to and read data from selected memory cells are well known in the art. Thus, the details thereof have been omitted from this specification in order to allow the reader to focus on the salient aspects of the disclosed embodiments.

With the above-described configuration, concurrent read operations of all the 3P-SRAM cells in a selected column can be used to effectively accomplish an XNOR-bitcount-compare function because the digital output (Q) of a voltage comparator at the end of the selected column will indicate the final result from multiple XNOR operations, a bitcount of the outputs of the XNOR operations, and a comparison of the bitcount to a bitcount threshold.

Specifically, to accomplish an XNOR-bitcount-compare function, a bitline driver can pre-charge the common read bitline (e.g., 152A, 152B, . . . or 152m) and the corresponding capacitor (e.g., 402A, 402B, . . . or 402m) of a selected column (e.g., A, B, . . . or m) within the memory array 400. Next, the wordline drivers can selectively and exclusively activate only one of the two read bitlines in each of the rows (but not the other) during the same clock cycle in order to initiate concurrent read operations (i.e., parallel read operations). That is, the wordline drivers can be controlled so as to concurrently apply read pulses to a selected one of either the first read wordline or the second read wordline in each of the rows (i.e., to either $131_1$ or $141_1$ of row 1, either $131_2$ or $141_2$ of row 3, either $131_3$ or $141_3$ of row 3, . . . and either $131_n$ or $141_n$ of row n).

As discussed in detail above and illustrated in the truth table of FIG. 3, each 3P-SRAM cell 101 in a selected column that performs an XNOR operation will either enable the voltage level ($V_{CRBL}$) on the common read bitline for that selected column to be discharged through the cell or prevent the voltage level ($V_{CRBL}$) on the common read bitline from being discharged through the cell. Thus, the actual voltage level ($V_{CRBL}$) on the common read bitline at the end of concurrent XNOR operations of all 3P-SRAM cells in a given column will be indicative of how many of the 3P-SRAM cells 101 in that selected column enabled discharging of the voltage level ($V_{CRBL}$). For purposes of this discussion, concurrent XNOR operations occur when read pulses are concurrently applied to only one of the read wordlines in each of the rows and the concurrent XNOR operations are ended when the selected read wordline in each row is returned to the low voltage state (i.e., at the end of the read pulse).

The more 3P-SRAM cells 101 that enable discharging of $V_{CRBL}$, the lower $V_{CRBL}$ will be. Consequently, the actual voltage level ($V_{CRBL}$) on the common read bitline of a selected column at the end of the concurrent XNOR operations is also indicative of the bitcount of the results of the concurrent XNOR operations in that selected column. It should be understood that the bitcount of the results refers to the total number of logic "1" XNOR outputs by the 3P-SRAM cells 101 in the selected column.

Thus, at the end of the concurrent XNOR operations by the 3P-SRAM cells 101 in a selected column, the voltage comparator (e.g., 402A, 402B, . . . or 402m) for that selected column (e.g., A, B, . . . or m) can perform a compare operation to compare the actual voltage level ($V_{CRBL}$) on the common read bitline (e.g., 401A, 401B, . . . or 401m) to a reference voltage level ($V_{ref}$), which is predetermined so that it corresponds to a bitcount threshold, and can output a digital output (e.g., $Q_A$, $Q_B$, . . . or $Q_m$) indicating whether or not the actual voltage level ($V_{CRBL}$) is below the reference voltage level ($V_{ref}$). Thus, the digital output of the voltage comparator of the selected column will indicate whether or not the actual bitcount is below the bitcount threshold. For example, the bitcount threshold could be equal to one-half the total number of 3P-SRAM cells 101 in a column and the reference voltage ($V_{ref}$) can be set so that it is approximately equal to the expected voltage level on a common read bitline if one-half of the total number of 3P-SRAM cells 101 in a column enabled discharging of $V_{CRBL}$. In this case, the digital output of a given voltage comparator would be a logic "0", if less than half of the 3P-SRAM cells 101 enabled discharging of $V_{CRBL}$; whereas the digital output would be a logic "1", if at least half of the 3P-SRAM cells 101 enabled discharging of $V_{CRBL}$.

Those skilled in the art will recognize that the discharge rate (D) of any given common read bitline can be estimated as follows:

$$D = I/CV \qquad (1)$$

where C refers to read bitline capacitance, where V refers to the voltage change (i.e., the initial voltage—the final voltage at the end of the concurrent XNOR operations; e.g. if half of the bitcells discharge, V will be equal to the pre-charge voltage ($V_{pre\_charge}$) minus the reference voltage ($V_{ref}$)) and where I refers to discharge current. The capacitance (C) of the common read bitline is a function of the size of the capacitor and the size of the capacitor can vary depending upon the technology node and the layout, but will be essentially fixed in the final structure. The discharge current (I) will depend upon the pull down strength of the read stacks of the memory cells. While the pull down strength is a function of the size of the FETs within the memory cells, it is also a function of the voltage level applied to the pass-gate transistor during a read operation. Thus, for concurrent read operations, the amplitude of the read pulse (i.e., the maximum voltage level of the read pulse) applied to the selected read wordline in each of the rows of memory cells can be adjusted to selectively tune the discharge rate. Furthermore, the pulse width can be selectively adjusted based on the expected discharge rate and the reference voltage (Vref). That is, a higher pulse amplitude (i.e., a higher read wordline activation voltage) can employed to speed up the discharge rate and in this case a shorter pulse width can be used to detect if/when more than half of the memory cells have enabled discharging, thereby increasing throughput albeit with a possible tradeoff for accuracy. Alternatively, a lower pulse amplitude (i.e., a lower read wordline activation voltage) can employed to slow down the discharge rate and in this case a longer pulse width can be used to detect if/when more than half of the memory cells have enabled discharging, thereby decreasing throughput but improving accuracy.

Additionally, those skilled in the art will recognize that, due to process variations, the pull down strengths of the memory cells may vary across the memory array. As a result, the voltage levels on different common read bitlines for different columns may vary even when the exact same number of memory cells in each of those columns enabled discharging of the read bitline voltage. Such process variation-induced voltage variation across the common read bitlines could lead to read errors depending upon where the reference voltage is set. In order to minimize this process variation-induced voltage variation across the common read bitlines within the memory array and thereby to reduce read errors, the number of memory cells per read bitline column can be increased.

Figure 5A:
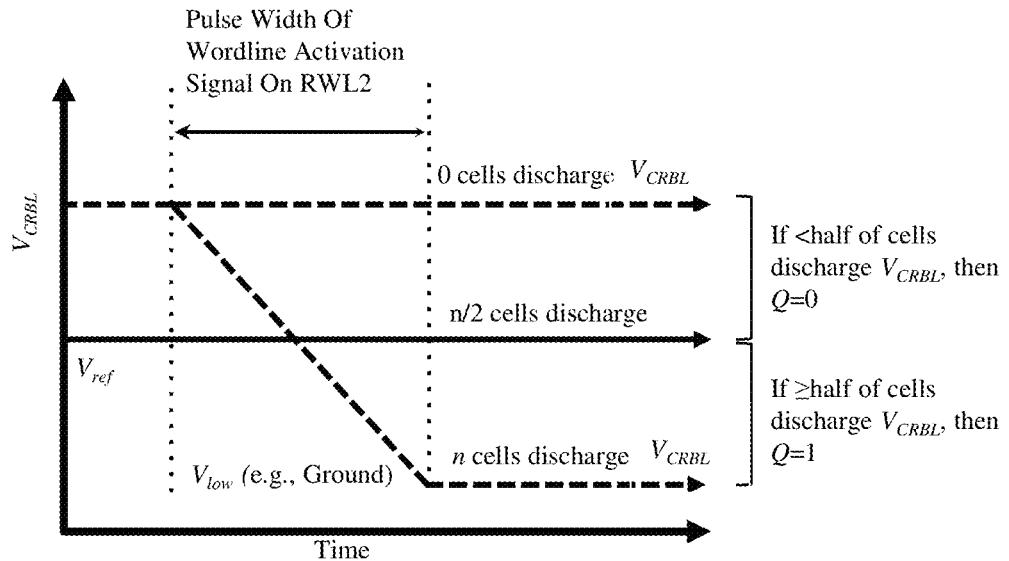
FIGS. 5A and 5B are graphs illustrating exemplary reference voltages suitable for detecting when half of the 3P-SRAM cells in a given column of a memory array have discharged the voltage level on the common read bitline ($V_{CRBL}$)
Figure 5B:
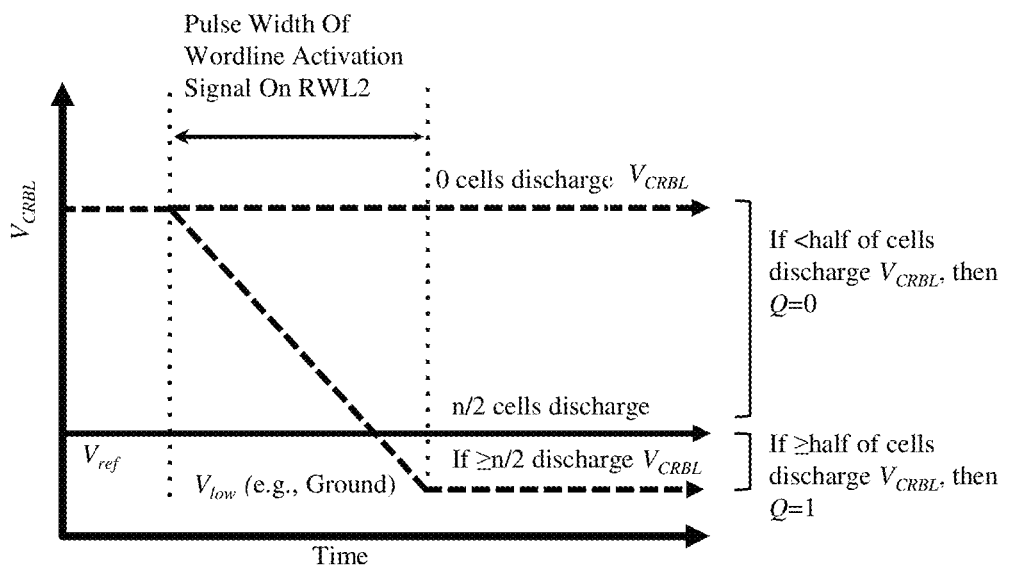

Thus, it should be understood that the specific characteristics of the memory array components (e.g., the size of the capacitors 402A, 402B, . . . and 402m, the sizes of the transistors within the 3P-SRAM cells 101, etc.) and the configuration of the memory array itself (e.g., the number of memory cells per common read bitline) can be predetermined during the design phase and, depending upon the BNN application, the specifications employed when performing the concurrent XNOR-bitcount-compare operations using the memory array (e.g., the read pulse amplitude, the read pulse width, the reference voltage, etc.) can be selectively adjusted during operation for optimal BNN speed and/or power consumption and accuracy. That is, a combination of design and operational decisions can be made in order to ensure that, after pre-charging, the $V_{CRBL}$ on each common read bitline can be stepped down at a given discharge rate without being fully discharged to ground within a predetermined time period (i.e., by the end of the read pulse) when less than some predetermined number of the 3P-SRAM cells 101 in the column enable discharging of $V_{CRBL}$. For example, as illustrated in FIG. 5A, the combination of design and operational decisions mentioned above can be made in order to ensure that, after pre-charging, $V_{CRBL}$ can be stepped down without being fully discharged to ground unless all n 3P-SRAM cells 101 in the column discharged $V_{CRBL}$. Alternatively, as illustrated in FIG. 5B, the combination of design and operational decisions can be made in order to ensure that, after pre-charging, $V_{CRBL}$ can be stepped down without being fully discharged to ground unless at least half (i.e., >n/2) of the 3P-SRAM cells 101 in the column discharged $V_{CRBL}$.

In any case, the digital output (e.g., $Q_A$, $Q_B$, ... or $Q_m$) from one voltage comparator (e.g., 402A, 402B, ... or 402m) of one selected column (e.g., A, B, ... or m) following the concurrent XNOR operations performed by the 3P-SRAM cells in that selected column is effectively a final result of an XNOR-bitcount-compare function.

The above-discussion refers to an XNOR-bitcount-compare function being performed using one selected column. However, if multiple XNOR-bitcount-compare functions need to be performed and if those multiple XNOR-bitcount-compare functions have the same first digital inputs (A) and different second digital inputs (B), then the multiple XNOR-bitcount-compare functions can be performed in parallel (i.e., concurrently) in different columns of the memory array 400. Specifically, for parallel XNOR-bitcount-compare functions performed in different columns in the memory array, the logic states on the first read wordlines $131_1$, $131_2$, $131_3$, ... and $131_n$ will correspond to the same first digital inputs (A) that are applied across all of the columns. For each one of those XNOR-bitcount-compare functions, the true bits stored in the 3P-SRAM cells of a given column will correspond to column-specific second digital inputs (B). As a result, the voltage comparators (e.g., 402A, 402B, ... and 402m) for the different columns can concurrently output different digital outputs (e.g., $Q_A$, $Q_B$, ... and $Q_m$) indicating the results of the XNOR-bitcount-compare functions. Furthermore, since XNOR-bitcount-compare functions using the same first digital inputs are used in XNOR-NET type binary neural networks (BNNs), the disclosed memory array 400 can, for example, be employed for implementing an XNOR-NET BNN and, particularly, for performing in-parallel XNOR-bitcount-compare functions as a part of XNOR-NET BNN processing.

Figure 6:
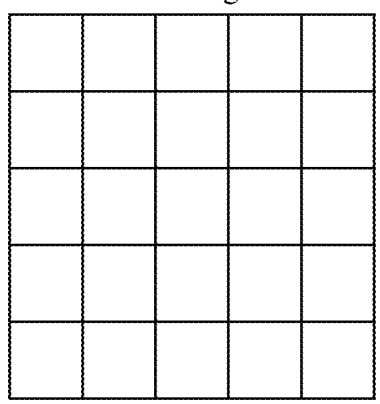
FIG. 6 shows a 5×5 pixel matrix for a two-dimensional (2D) digital image that can be subjected to XNOR-NET type binary neural network (BNN) processing for image recognition and characterization.
Figure 7:
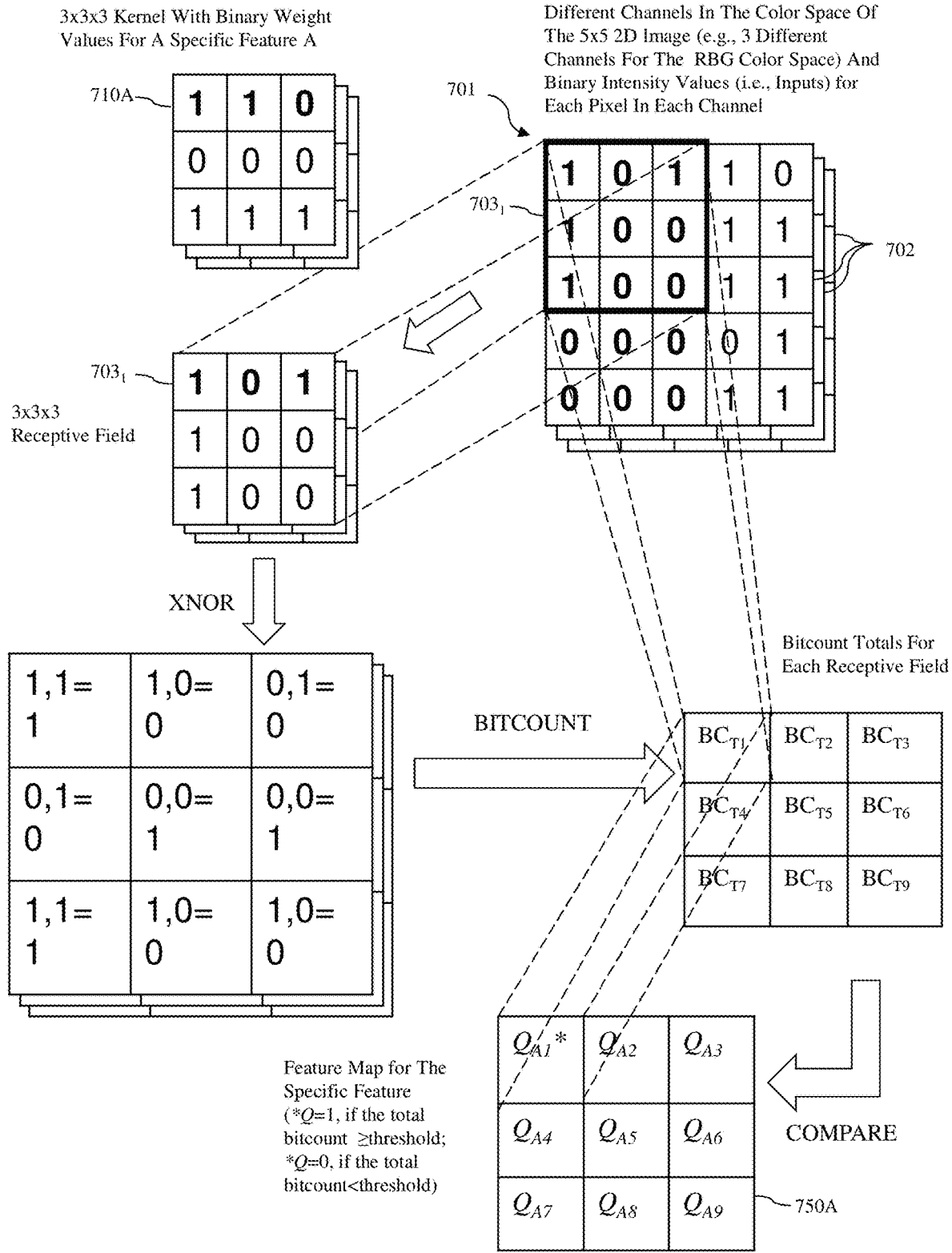
FIG. 7 illustrates XNOR-NET BNN processing of a single receptive field during generation of a feature map for a given feature.
Figure 8:
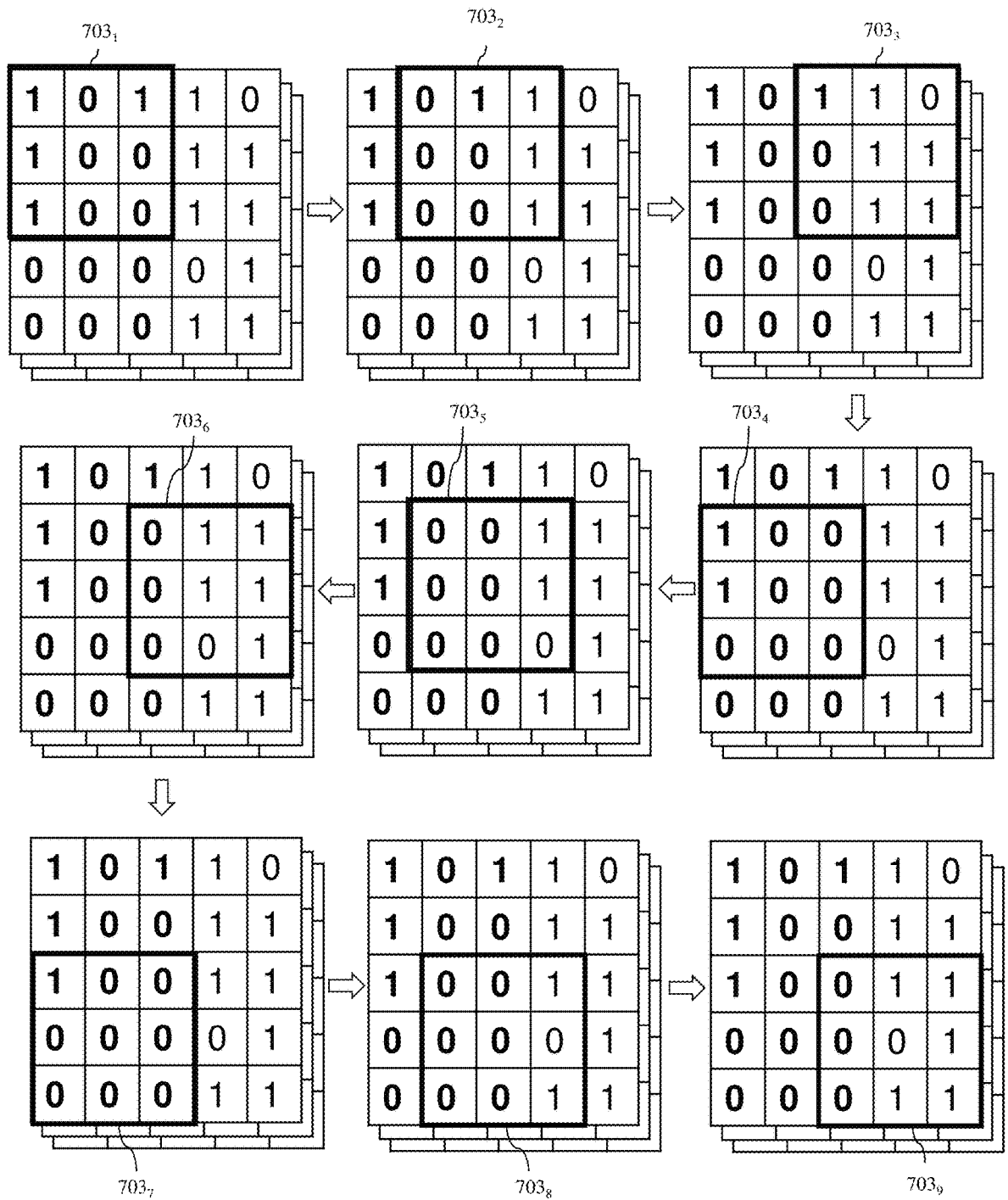
FIG. 8 illustrates each of nine exemplary 3×3×3 overlapping receptive fields that will be processed according to the flow shown in FIG. 8 in order to generate the feature map.

More specifically, FIG. 6 shows a 5×5 pixel matrix for a two-dimensional (2D) digital image that can be processed by an XNOR-NET BNN for image recognition and characterization. FIG. 7 further illustrates BNN processing of the pixel matrix of FIG. 6 to generate a feature map for a given feature. Referring to FIG. 7, typically a BNN views a 2D digital image, such as that shown in FIG. 6, as if it were a multi-layered image 701 (e.g., as shown in the upper right corner). In this multi-layered image 701, each of the layers 702 (also referred to in the art as depth slices) can be directed to the same 5×5 pixel matrix but represent a different one of multiple channels within a given color space. For example, for a red-blue-green (RBG) color space, the multi-layered image 701 can include three layers 702: one for the red channel, one for the blue channel and one for the green channel. Other color spaces could include, for example, a greyscale color space, cyan-magenta-yellow-black (CMYK) color space, a hue-saturation-lightness (HSL) color space, a hue-saturation-value (HSV) color space, etc. Each pixel in each layer 702 of the multi-layered image 701 can be associated with a corresponding intensity value. In XNOR-Net BNN's the actual pixel intensity value will be converted to a binary pixel intensity value. Techniques for converting actual pixel intensity values to binary pixel intensity values are known in the art. Thus, the details of the converting process are omitted from the specification in order to allow the reader to focus on the salient aspects of the disclosed embodiments. Furthermore, within the multi-layered image 701, multiple 3D receptive fields can be defined. Each of the receptive fields can be the same size with the depth in the Z direction being equal to the number of layers (e.g., 3) and with the width and height in the X and Y directions, respectively, including a smaller pixel matrix (e.g., a 3×3 pixel matrix) of the full pixel matrix of the 2D digital image. For example, see the 3×3×3 receptive field $703_1$ in the upper left corner of the multi-layered image 701. It should be noted that the additional receptive fields will shift sequentially by a set stride (i.e., a set number of pixels, such as one pixel, two pixels, etc.) when scanning from left to right and down such that they may overlap by a same number of pixels or such that they do not overlap at all. FIG. 8 illustrates nine exemplary 3×3×3 overlapping receptive fields $703_1$-$703_9$ defined in the multi-layered image 701.

During BNN processing each of many different features can be convolved and pooled using corresponding kernels (see discussion below) and the defined receptive fields $703_1$-$703_9$ in the multi-layer image 701 in order to generate feature maps that are eventually employed to recognize and characterize the image.

For example, a specific feature A could be a horizontal line, vertical line, etc. A kernel 710A can be developed (i.e., learned) for that specific feature A and can include a 3D matrix of weight values. The kernel 710A (i.e., the 3D matrix of weight values) will be the same size as each 3D receptive field. That is, the kernel 710A will have the same number of layers in the Z direction as each receptive field and the same width and height in the X and Y directions. Thus, for each pixel at each location in a given receptive field, there will be one corresponding weight value at a corresponding location in the kernel 710A for the specific feature A. It should be noted that the layers of the kernel can be identical. Additionally, it should be noted that in XNOR-NET BNN's, the actual weight value is converted to a binary weight value. Techniques for converting actual weight values to binary weight values are known in the art. Thus, the details of the converting process are omitted from the specification in order to allow the reader to focus on the salient aspects of the disclosed embodiments.

XNOR-bitcount-compare functions can then be performed by applying the kernel 710A to each of the receptive fields $703_1$-$703_9$ in order to generate digital outputs $Q_{A1}$-$Q_{A9}$, respectively, for insertion into a feature map 750A for the specific feature A. Specifically, consider an XNOR-bitcount-compare operation performed with respect to the kernel 710A and the receptive field $703_1$. First, XNOR operations can be performed with respect to the binary weight value and the binary pixel intensity value acquired from corresponding locations in the kernel 710A and the receptive field $703_1$. The illustration at the bottom left corner of FIG. 7 shows the results of those XNOR operations performed between the binary weight and pixel intensity values at corresponding locations in the first layer of the kernel and receptive field. Next, a total bitcount ($BC_{T1}$) for the results of all the XNOR operations across all of the layers in the kernel and receptive field can then be determined. After the total bitcount ($BC_{T1}$) is determined, a digital output ($Q_{A1}$) for the XNOR-bitcount-compare operation can be determined by comparing the total bitcount ($BC_{T1}$) to some threshold bitcount. The threshold bitcount can be, for example, approximately equal to one half the number of pixels in the 3D receptive field (e.g., for a 3×3×3 receptive field with 27 pixels, the bitcount threshold could be 13 or 14). Furthermore, the digital output ($Q_{A1}$) can be a logic "1", when the total bitcount ($BC_{T1}$) is greater than or equal to the bitcount threshold, or logic "0", when the total bitcount ($BC_{T1}$) is less than the bitcount threshold.

The same XNOR-bitcount-compare operation can be performed with respect to the kernel 710A for the specific feature A and each of the other receptive fields 703$_2$-703$_9$ so that digital outputs for the specific feature A are generated for each receptive field. Thus, in FIG. 7, $BC_{T2}$ refers to the total bitcount of results of all XNOR operations when the kernel 710A is applied to the receptive field 703$_2$, $BC_{T2}$ refers to the total bitcount of results of all XNOR operations when the kernel 710A is applied to the receptive field 703$_3$, and so on. Furthermore, $Q_{A2}$ refers to the the digital output of an XNOR-bitcount-compare operation where the kernel 710A for the specific feature A is applied to the receptive field 703$_2$, $Q_{A3}$ refers to the the digital output of an XNOR-bitcount-compare operation where the kernel 710A for the specific feature A is applied to the receptive field 703$_3$, and so on. The digital outputs $Q_{A1}$ to $Q_{A9}$ can be inserted into a feature map 750A for the specific feature A at locations corresponding to the locations of the receptive fields 703$_1$-703$_9$ in the image 701.

Multiple different feature maps associated with different specific features, respectively, can generated for the same multi-layer image 701 in the same manner as described above using the exact same receptive fields 703$_1$-703$_9$ (i.e., with the same binary pixel intensity values) and but different kernels with different binary weight values. All of the feature's maps for all of the specific features can be employed during subsequent BNN processing used to recognize and characterize the image.

The above-described XNOR-bitcount-compare functions can be performed using the disclosed memory array 400 with the 3P-SRAM cells 101 and, depending upon the set up, multiple ones of these XNOR-bitcount-compare functions can be performed in parallel such that the memory array 400 can be employed to implement an XNOR-NET BNN.

Figure 9:
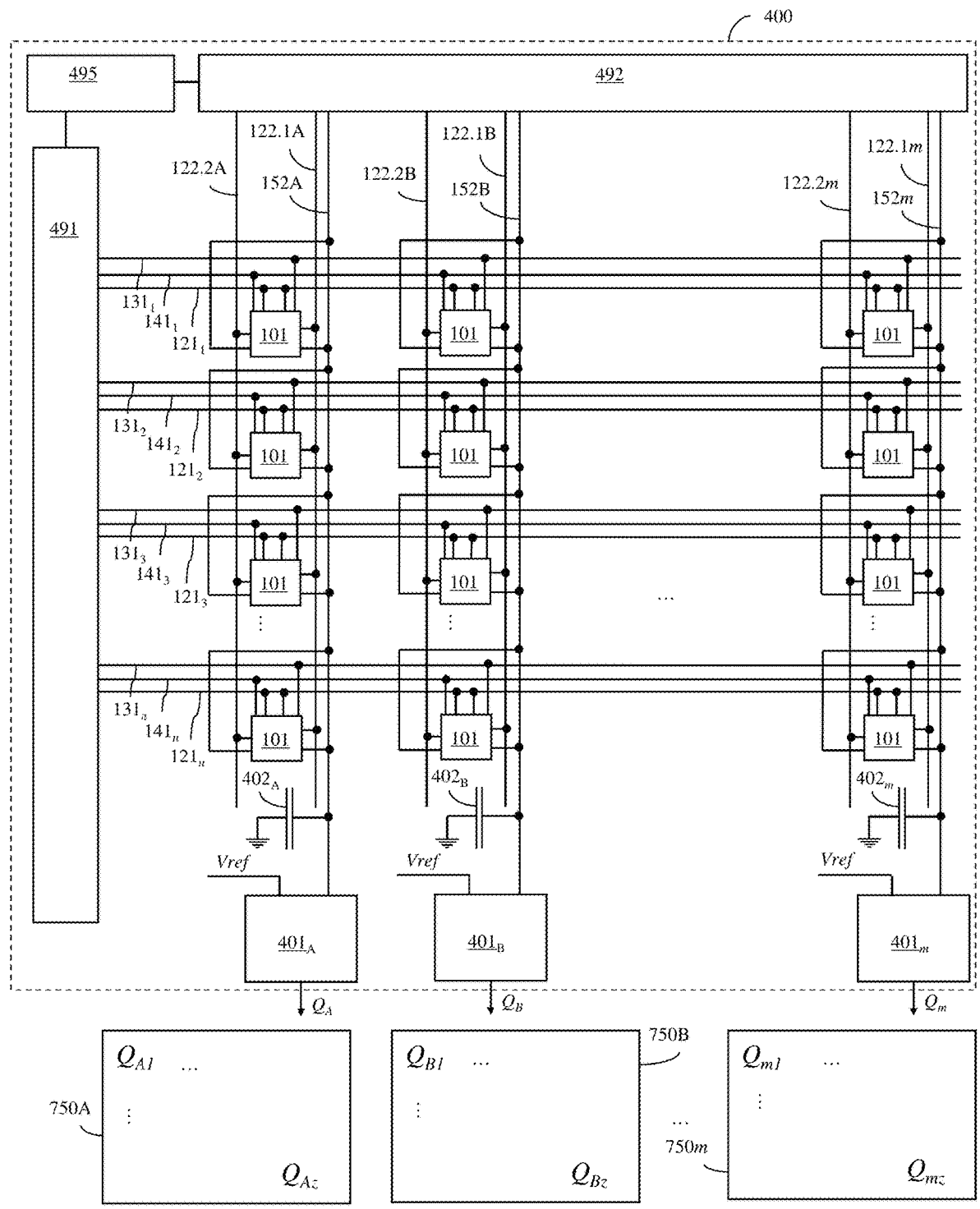
FIG. 9 is a schematic diagram illustrating the memory array of FIG. 4 specifically configured to perform in-memory computing of XNOR-bitcount-compare functions of a BNN.

Specifically, as illustrated in FIG. 9, the memory array 400 can, during a clock cycle, perform parallel XNOR-bitcount-compare functions to process in one run inputs from one receptive field and inputs from multiple different kernels so that digital outputs $Q_A$, $Q_B$, . . . , and $Q_m$ from the voltage comparators 401A, 401B, . . . , and 401m of the different columns can be inserted, in parallel, into different feature maps 750A, 750B, . . . , and 750m, respectfully, for different features (e.g., horizontal lines, vertical lines, etc.). The memory array 400 can further repeat the parallel XNOR-bitcount-compare functions, during subsequent clock cycles, to process the inputs from each of multiple receptive fields with the inputs from the multiple different kernels (i.e., to process inputs from one new receptive field and the same kernels during each successive run) so that the digital outputs $Q_A$, $Q_B$, . . . , and $Q_m$ of the voltage comparators 401A, 401B, . . . , and 401m of the different columns following each successive run are inserted into different locations in the different feature maps 750A, 750B, . . . , and 750m in order to fill-in those features maps.

To accomplish this, the number of columns can be equal to some number m of different features and the number of rows can be equal to a total number n of pixels in each 3D receptive field (and in each 3D kernel).

Write operations can be performed to store a true bit in the true storage node 115.1 (NT) of the 3P-SRAM cell and, thus, a complement bit in the complement storage node 115.2 (NC) of each 3P-SRAM cell 101. Those skilled in the art will recognize that the complement bit will always be the complement of the stored true bit. That is, if the stored true bit is a logic "1", then the complement bit at the complement storage node 115.2 (NC) will be a logic "0" and vice versa. Furthermore, the true bits stored at the true storage node 115.1 (NT) of each 3P-SRAM cell 101 in a given column can correspond to the binary weight values for each pixel location in a specific 3D kernel for a specific feature. Thus, the true bits stored in the 3P-SRAM cells 101 in column A can correspond to the binary weight values in the kernel 710A for the specific feature A, the true bits stored in the 3P-SRAM cells 101 in column B can correspond to the binary weight values in a different kernel for the specific feature B, and so on.

Because, as discussed above, in XNOR-NET BNN processing different features maps are generated using different kernels, but the same receptive fields (i.e., with the same binary pixel intensity values), parallel XNOR-bitcount-compare functions can be performed across all the different columns of the memory array. Specifically, for a first run, the common read bitlines 152A, 152B, . . . and 152m and, thereby the capacitors 402A, 402B, . . . and 402m for all of the columns can be pre-charged (e.g., by the bitline drivers) to select all columns. Then, either the first read wordline or the second read wordline in each row can be selectively and exclusively activated (e.g., by the wordline drivers) through application of read pulses only one of the read wordlines in each row such that the logic states of the first read wordlines 131$_1$, 131$_2$, . . . 131$_n$ in the rows correspond to the binary pixel intensity values for each pixel location in a first 3D receptive field. Thus, the digital outputs $Q_{A1}$, $Q_{B1}$, . . . , and $Q_{m1}$ from the voltage comparators 401A, 401B, . . . and 401m of each column can be inserted into the first locations in the corresponding feature maps 750A, 750B, . . . , and 750m, respectively. For a second run, the common read bitlines 152A, 152B, . . . and 152m and, thereby the capacitors 402A, 402B, . . . and 402m for all of the columns can again be pre-charged (e.g., by the bitline drivers) to select all columns. Then, either the first read wordline or the second read wordline in each row can be selectively and exclusive activated (e.g., by the wordline drivers) through application of read pulses only on of the two read wordlines in each row such that the logic states of the first read wordlines 131$_1$, 131$_2$, . . . 131$_n$ in the rows correspond to the binary pixel intensity values for each pixel location in a second 3D receptive field. Thus, the digital outputs $Q_{A2}$, $Q_{B2}$, . . . , and $Q_{m2}$ from the voltage comparators 401A, 401B, . . . and 401m of each column can be inserted into the second locations in the corresponding feature maps 750A, 750B, . . . , and 750m, respectively. Such runs can be performed until a last run is completed and the digital outputs $Q_{Az}$, $Q_{Bz}$, . . . , and $Q_{mz}$ have been inserted into the last locations in the corresponding feature maps 750A, 750B, . . . , and 750m, respectively.

As mentioned above, due to process variations, the pull down strengths of the memory cells may vary across the memory array 400. As a result, the voltage levels on different common read bitlines for different columns may vary even when the exact same number of memory cells in each of those column have enabled read bitline voltage discharging. The process variation-induced voltage variation across the common read bitlines can lead to errors and, particularly, can reduce the accuracy of the compare results depending upon where the reference voltage is set. In order to minimize process variation-induced voltage variation across the common read bitlines and thereby reduce read errors, the number of memory cells per read bitline column can be increased. Thus, the accuracy of the BNN Q values can be improved by increasing the number of the 2D kernels that subsequently increases the size of the 3D filters for the hidden layers of the BNN. Increasing the size of the 3D filters necessitates a corresponding increase in the number of 3P-SRAM cells 101 per column.

It should be understood that FIG. 9 and the discussion above is provided for illustration purposes and is not intended to be limiting. It is anticipated that alternative techniques could be used for inserting binary weight values from different kernels and binary pixel intensity values from different receptive fields into the memory array 400 in order to accomplish XNOR-bitcount-compare operations during the same or different clocks cycles and, thereby generate the digital output values needed to fill in the different feature maps during XNOR-NET BNN processing.

In any case, since, as discussed above, the memory array embodiments can include a single capacitor per common read bitline and since each capacitor can be formed in the BEOL metal levels of the IC chip above the active device layer with the 3P-SRAM cells, the disclosed memory array embodiments can be employed to minimize chip area consumption. Furthermore, since, as discussed above, the specifications for performing concurrent XNOR-bitcount-compare operations using the disclosed memory array (e.g., the read pulse amplitude, the read pulse width, the reference voltage, etc.) can be selectively adjusted for optimal BNN speed and/or power consumption and accuracy, the disclosed memory array embodiments can further be employed for improved manufacturability and performance (i.e., processing speed) and/or power consumption and accuracy.

Figure 10:
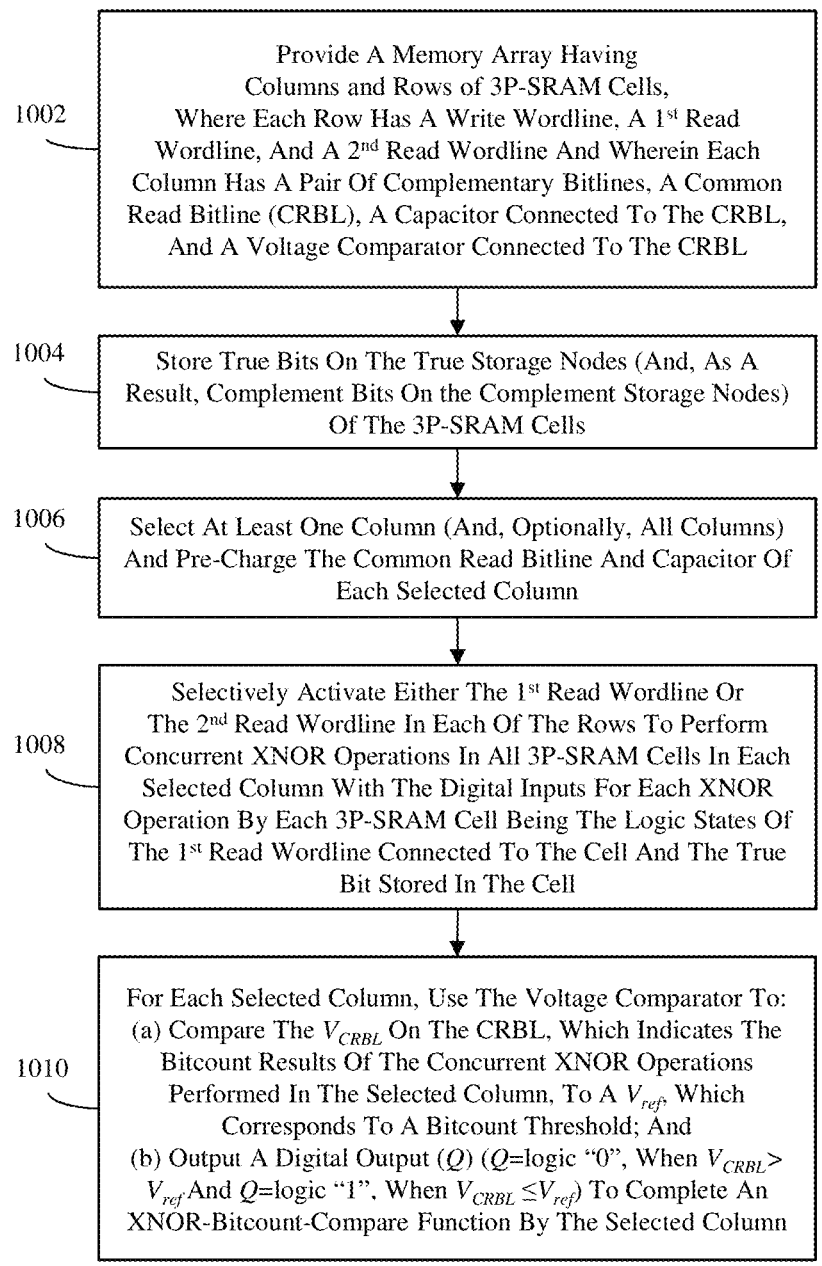
FIG. 10 is a flow diagram illustrating an in-memory computing method.

Referring to the flow diagram of FIG. 10, also disclosed herein are embodiments of an in-memory computing method and, particularly, a method for in-memory computing of XNOR-bitcount-compare functions.

Figure 4:
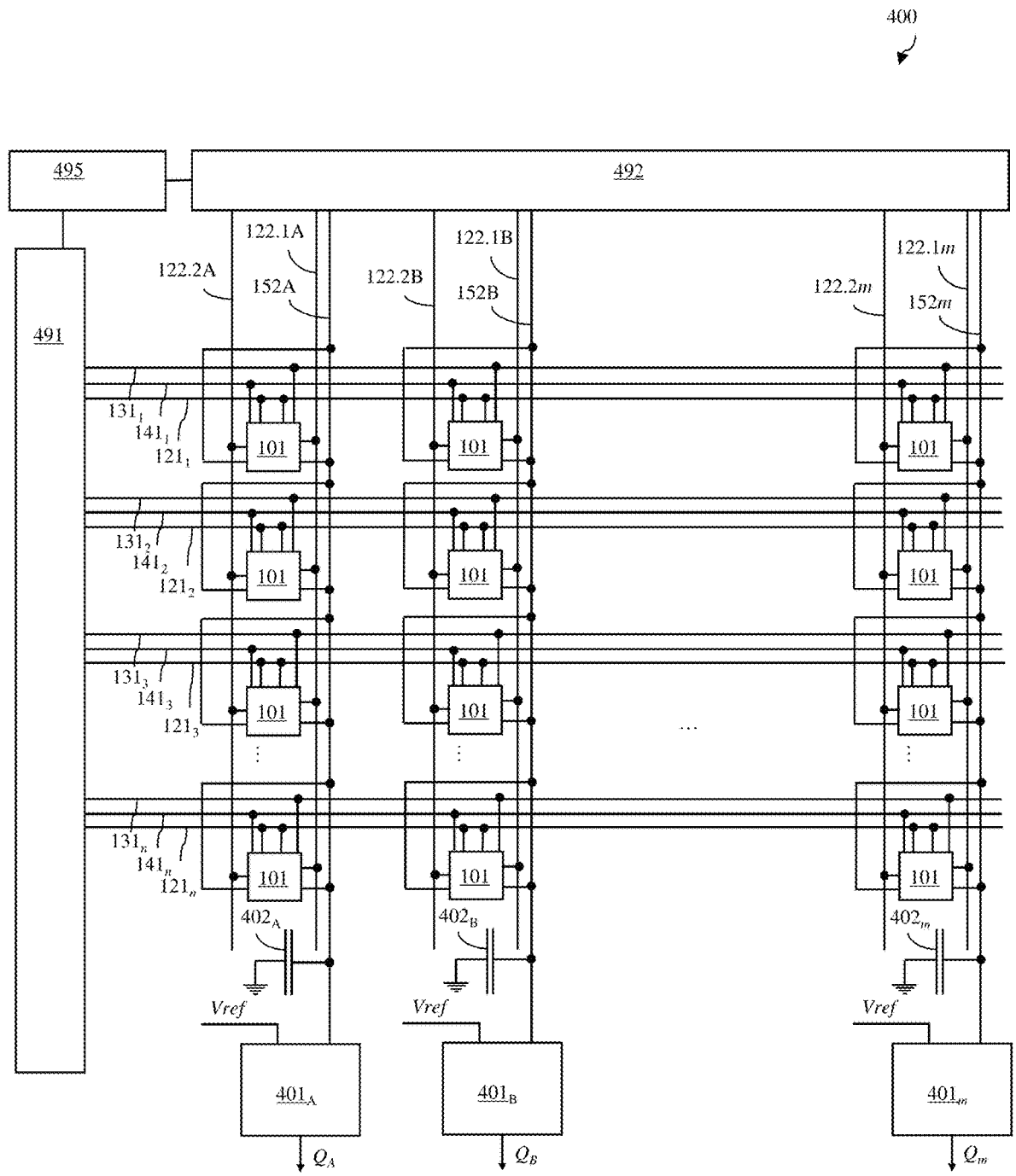
FIG. 4 is a schematic diagram illustrating an embodiment of a memory array including 3P-SRAM cell and configured to perform in-memory computing.

The method can include providing a memory array 400, as described in detail above and illustrated in FIG. 4 or FIG. 9 (see process step 1002). Specifically, the memory array 400 can include columns and rows of 3P-SRAM cells 101, as described in detail above and illustrated in FIG. 1. The method can further include storing data values in the 3P-SRAM cells 101 of the memory array 400 (see process step 1004). Specifically, the method can include performing write operations to store true bits on the true storage nodes 115.1 (and, as a result, complement bits on the complement storage nodes 115.2) of each 3P-SRAM cell 101 in the memory array 400.

The method can further include selecting at least one column in the memory array 400 and, optionally, all of the columns in the memory array 400 and using bitline driver(s) to pre-charge the common read bitline 152 and thereby the capacitor 402 of each selected column (see process step 1006).

The method can further include using wordline drivers to selectively and exclusively applying read pulses to only one of the first read wordline 131 and the second read wordline 141 in each of the rows (i.e., to either the first read wordline 131 or the second read wordline 141 in each row, but not both) so that concurrent XNOR operations are performed by all of the 3P-SRAM cells 101 in each selected column (see process step 1008). It should be understood that a read pulse refers to a pulse of a sufficiently high positive voltage to represent a high logic state (i.e., a logic value of "1") on the read wordline during the duration of the pulse. When a read pulse is applied to only one of the two read wordlines, the other of the two read wordlines will have a low logic state (i.e., a logic value of "0").

As discussed in detail above with regard to the truth table of FIG. 3B, the digital inputs for each XNOR operation performed by each 3P-SRAM cell 101 will include the logic state of the first read wordline 131 connected to that 3P-SRAM cell 101 and the logic state of the true bit stored on the true storage node 115.1 within that 3P-SRAM cell 101. The result of the XNOR operation will be either: (a) the voltage level ($V_{CRBL}$) on the common read bitline 152 connected to the 3P-SRAM cell 101 will be discharged through the 3P-SRAM cell 101 (i.e., $V_{CRBL}$ drops), as indicated by the down arrow in the truth table of FIG. 3B, which represents a logic "1"; or (b) the voltage level ($V_{CRBL}$) on the common read bitline will not discharged through the 3P-SRAM cell 101, as indicated by the dash in the truth table of FIG. 3B, which represents a logic "0".

The method can further include, at the end of the concurrent XNOR operations in each selected column (i.e., when the selected read wordline in each row is returned to a low voltage state following the read pulse), using the voltage comparator of each selected column (e.g., voltage comparator 401A for column A, 401B for column B, etc.) to perform a comparison of the actual voltage level ($V_{CRBL}$), which is on the common read bitline of the selected column, to a reference voltage level ($V_{ref}$) and to output a digital output (Q) for the selected column based on the results of the comparison (see process step 1010). As discussed above, the actual voltage level ($V_{CRBL}$) on the common read bitline of a selected column at the end of the concurrent XNOR operations performed by the 3P-SRAM cells in the selected column will be indicative of how many of the 3P-SRAM cells in that selected column enabled discharging of the common read bitline. Thus, the actual voltage level ($V_{CRBL}$) will be indicative of a bitcount of the results of the concurrent XNOR operations in the selected column. Furthermore, the reference voltage level ($V_{ref}$) can be predetermined so that it corresponds to a bitcount threshold (e.g., so that it is approximately equal to the expected voltage level on the common read bitline if one-half of the memory cells enable discharging of the common read bitline). Thus, the digital output (Q) from the voltage comparator of each selected column will indicate whether or not the actual bitcount for the concurrent XNOR operations performed therein is below the bitcount threshold.

For example, the bitcount threshold could be equal to one-half the total number of 3P-SRAM cells in a column and the reference voltage ($V_{ref}$) can be set so that it corresponds to what the voltage level ($V_{CRBL}$) on a common read bitline would be if one-half of the total number of 3P-SRAM cells 101 in the column enabled discharging of $V_{CRBL}$. In this case, the digital output (Q) of a voltage comparator 401 would be a logic "0", if less than half of the 3P-SRAM cells 101 enabled discharging of $V_{CRBL}$, whereas the digital output (Q) of a voltage comparator 401 would be a logic "1", if at least half of the 3P-SRAM cells 101 enabled discharging of $V_{CRBL}$. In other words, the digital output (Q) of the voltage comparator 401 of a selected column following the concurrent XNOR operations performed in the selected column is effectively a final result of an XNOR-bitcount-compare function.

As discussed in greater detail above with regard to the memory array 400, multiple XNOR-bitcount-compare functions may be performed in parallel and, particularly, during the same clock cycle, in the different columns, respectively, when the first digital inputs, which are to be applied to the first read wordlines of the rows are the same for all the XNOR-bitcount-compare functions and when only the second digital inputs, which are stored in the true storage nodes of the 3P-SRAM cells, vary from column to column. Furthermore, since XNOR-bitcount-compare functions are used in XNOR-NET type binary neural networks (BNNs), the in-memory computing method can be employed for implementing an XNOR-NET BNN.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory cell comprising:
a first storage node configured to store a bit of data;
a first read pass-gate transistor and a first read pull-down transistor connected in series between a common read bitline and a first voltage rail, wherein a gate of the first read pass-gate transistor is connected to a first read wordline, and wherein a gate of the first read pull-down transistor is connected to the first storage node;
a second storage node configured to store a one's complement of the bit of data;
a second read pass-gate transistor and a second read pull-down transistor connected in series between the common read bitline and the first voltage rail, wherein a gate of the second read pass-gate transistor is connected to a second read wordline, and wherein a gate of the second read pull-down transistor is connected to the second storage node;
a capacitor connected to the common read bitline and controlling a discharge rate of the common read bitline to prevent a voltage level on the common read bitline from fully discharging to a ground reference voltage level during stepping down of the voltage level on the common read bitline;
a first write pass-gate transistor connected to the first storage node; and
a second write pass-gate transistor connected to the second storage node,
wherein a gate of the first write pass-gate transistor and a gate of the second write pass-gate transistor are connected to a same write wordline for concurrent write access to the first storage node and the second storage node.

2. The memory cell of claim 1, wherein:
during a read operation to accomplish an XNOR operation, the common read bitline is pre-charged and a read pulse is applied selectively to only one of the first read wordline and the second read wordline; and
during the read pulse applied,
digital inputs for the XNOR operation performed by the memory cell are logic states of the first read wordline and the bit of data is stored at the first storage node, and
an output of the XNOR operation performed by the memory cell is determinable based on whether discharging of the voltage level on the common read bitline of the memory cell occurs.

3. The memory cell of claim 2, wherein:
when both the first read wordline and the bit of data have a same logic state, the discharging of the voltage level on the common read bitline of the memory cell occurs and indicates the output of the XNOR operation is a high logic state; and
when the first read wordline and the bit of data have different logic states, the discharging of the voltage level on the common read bitline of the memory cell is prevented and indicates the output of the XNOR operation is a low logic state.

4. The memory cell of claim 2, wherein:
the memory cell is incorporated into a memory array configured for in-memory computing of binary neural network operations; and
the logic states of the first read wordline and the bit of data correspond to a binary input value and a binary weight value.

5. The memory cell of claim 1, further comprising:
the first voltage rail implemented as a ground rail or a negative voltage rail;
a second voltage rail implemented as a positive voltage rail;
a pair of cross-coupled inverters connected between the first voltage rail and the second voltage rail and comprising a first inverter and a second inverter; and
a pair of complementary bitlines comprising a first bitline and a second bitline,
wherein
the first inverter comprises the first storage node,
the second inverter comprises the second storage node,
the first write pass-gate transistor is connected between the first storage node and the first bitline, and
the second write pass-gate transistor is connected between the second storage node and the second bitline.

6. A memory array comprising memory cells arranged in columns and rows of the memory array, wherein:
each column of the memory array comprises
a common read bitline,
a voltage comparator connected to the common read bitline, and
a capacitor connected to the common read bitline and controlling a discharge rate of the common read bitline to prevent an actual voltage level on the common read bitline from fully discharging to a ground reference voltage level during stepping down of the actual voltage level on the common read bitline;
each row of the memory array comprises
a first read wordline, and
a second read wordline; and
each of the memory cells comprises
a first storage node configured to store a bit of data,
a first read pass-gate transistor and a first read pull-down transistor connected in series between a first voltage rail and the common read bitline of one of the columns including the memory cell of the first storage node, a gate of the first read pass-gate transistor is connected to the first read wordline for a row including the memory cell of the first storage node, and a gate of the first read pull-down transistor is connected to the first storage node,
a second storage node configured to store a one's complement of the bit of data,
a second read pass-gate transistor and a second read pull-down transistor connected in series between the common read bitline of the one of the columns and the first voltage rail, a gate of the second read pass-gate transistor is connected to the second read wordline of the row, and a gate of the second read pull-down transistor is connected to the second storage node.

7. The memory array of claim 6, further comprising bitline drivers and wordline drivers, wherein:
during concurrent read operations of all of the memory cells in a selected one of the columns to accomplish concurrent XNOR operations, a bitline driver pre-charges the common read bitline and the capacitor of the selected one of the columns;
the wordline drivers selectively apply read pulses to only one of the first read wordline and the second read wordline in each of the rows;
following the read pulses, the voltage comparator of the selected one of the columns compares the actual voltage level on the common read bitline for the selected one of the columns to a reference voltage level and generates a digital output;
the actual voltage level on the common read bitline is indicative of a bit count of results of the concurrent XNOR operations performed by the memory cells in the selected one of the columns; and
the reference voltage level corresponds to a bit count threshold such that the digital output indicates whether the bit count is below the bit count threshold.

8. The memory array of claim 7, wherein, for an XNOR operation performed by each of the memory cells in the selected one of the columns:
digital inputs are provided as
logic states of the first read wordline connected to one of the memory cells, and
the bit of data stored at the first storage node of the one of the memory cells and an output of the XNOR operation performed by the one of the memory cells is determinable based on whether discharging of the actual voltage level on the common read bitline of the selected one of the columns of the one of the memory cells occurs.

9. The memory array of claim 8, wherein:
when both the first read wordline connected to the one of the memory cells and the bit of data have a same logic state, the discharging of the actual voltage level on the common read bitline of the one of the memory cells occurs and indicates the output of the XNOR operation of the one of the memory cells is a high logic state; and
when the first read wordline, connected to the one of the memory cells, and the bit of data have different logic states, the discharging of the actual voltage level on the common read bitline of the one of the memory cells is prevented and indicates the output of the XNOR operation of the one of the memory cells is a low logic state.

10. The memory array of claim 6, wherein:
the memory array further comprises bitline drivers and wordline drivers;
during concurrent read operations of the memory cells in the columns of the memory array and to accomplish concurrent XNOR operations,
the bitline drivers pre-charge the common read bitlines and the capacitors, and
the wordline drivers selectively apply read pulses to only one of the first read wordline and the second read wordline in each of the rows;
following the read pulses, voltage comparators connected to different common read bitlines of different columns perform compare operations;
each of the compare operations performed by one of the voltage comparators, connected to one of the common read bitlines in one of the columns, comprises comparing the actual voltage level on the one of the common read bitlines to a reference voltage level and outputting a digital output;
the actual voltage level on the one of the common read bitlines is indicative of a bit count of results of the concurrent XNOR operations performed by the memory cells in the one of the columns; and
the reference voltage level corresponds to a bit count threshold such that the digital output of the one of the voltage comparators for the one of the columns indicates whether the bit count is below the bit count threshold.

11. The memory array of claim 10, wherein:
the memory array is configured for in-memory parallel computing of binary neural network operations; and
the concurrent XNOR operations performed by the memory cells in the columns of the memory array occur in one clock cycle with logic states of first read wordlines corresponding to binary input values from a first receptive field, with logic states of bits stored in the memory cells of the columns corresponding to binary weight values from different kernels associated with different features, respectively, and with digital outputs from the voltage comparators of the columns being inserted into feature maps for the different features at a same location corresponding to the particular receptive field.

12. The memory array of claim 11, wherein the concurrent XNOR operations performed by the memory cells in the columns of the memory array are repeated during subsequent clock cycles such that:
at each subsequent clock cycle logic states of the first read wordlines correspond to different binary input values from a second receptive field, wherein the second receptive field is different than the first receptive field;
the logic states of the bits stored in the memory cells of the columns continue to correspond to binary weight values from the different kernels associated with the different features, respectively; and
the digital outputs from the voltage comparators of the columns are inserted into the feature maps for the different features at a location corresponding to the second receptive field.

13. The memory array of claim 6, wherein each of the memory cells further comprises:
a pair of cross-coupled inverters connected between the first voltage rail and a second voltage rail and comprising a first inverter and a second inverter;
a first write pass-gate transistor; and
a second write pass-gate transistor,
wherein
the first voltage rail implemented as a ground rail or a negative voltage rail;
the second voltage rail implemented as a positive voltage rail;
the first inverter comprises the first storage node;
the second inverter comprises the second storage node;
the first write pass-gate transistor is connected between the first storage node and a first bitline of a pair of complementary bitlines for a corresponding one of the columns;
the second write pass-gate transistor is connected between the second storage node and a second bitline of the pair of complementary bitlines; and
a gate of the first write pass-gate transistor and a gate of the second write pass-gate transistor are both connected to a write wordline for a corresponding one of the rows.

14. The memory array of claim 6, wherein:
the memory cells are implemented in an active device layer on an integrated circuit chip; and
the capacitors connected respectively to the common read bitlines, wherein the capacitors comprise metal-on-metal capacitors.

15. A method comprising:
providing a memory array comprising memory cells arranged in columns and rows of the memory array, wherein each of the columns of the memory array comprise a common read bitline, a voltage comparator connected to the common read bitline, and a capacitor connected to the common read bitline,
wherein each of the rows of the memory array comprise a first read wordline and a second read wordline,
wherein each of the memory cells comprises
a first storage node configured to store a bit of data,
a first read pass-gate transistor and a first read pull-down transistor connected in series between the common read bitline for one of the columns including the memory cell and a first voltage rail,
a second storage node configured to store a one's complement of the bit of data, and
a second read pass-gate transistor and a second read pull-down transistor connected in series between the common read bitline for the one of the columns and the first voltage rail,
wherein a gate of the first read pass-gate transistor and a gate of the first read pull-down transistor are connected to the first read wordline of one of the rows including the memory cell and to the first storage node, respectively, and
wherein a gate of the second read pass-gate transistor and a gate of the second read pull-down transistor are connected to the second read wordline for the one of the rows and to the second storage node, respectively;
pre-charging the common read bitline and the capacitor of at least one selected column and selectively applying read pulses to only one of the first read wordline and the second read wordline in each of the rows such that concurrent XNOR operations are performed by memory cells in the at least one selected column;
controlling a discharge rate of the common read bitline via the capacitor to prevent an actual voltage level of the common read bitline from fully discharging to a ground reference voltage level during stepping down of the actual voltage level of the common read bitline; and
performing a comparison of the actual voltage level on the common read bitline of the at least one selected column to a reference voltage level and outputting a digital output,
wherein the actual voltage level on the common read bitline of the at least one selected column is indicative of a bit count of results of the concurrent XNOR operations performed by the memory cells in the at least one selected column, and
wherein the reference voltage level corresponds to a bit count threshold such that the digital output indicates whether the bit count is below the bit count threshold.

16. The method of claim 15, wherein, for an XNOR operation performed by one of the memory cells in the at least one selected column,
digital inputs are provided as
logic states of the first read wordline connected to the one of the memory cells, and
the bit of data stored at the first storage node of the one of the memory cells; and
an output of the XNOR operation performed by the one of the memory cells in the at least one selected column is determinable based on whether discharging of the actual voltage level on the common read bitline of the at least one selected column through the one of the memory cells occurs.

17. The method of claim 16, wherein:
when both the first read wordline connected to the one of the memory cells and the bit of data have a same logic state, the discharging of the actual voltage level on the common read bitline through the one of the memory cells occurs and indicates the output of the XNOR operation is a high logic state, and when the first read wordline connected to the one of the memory cells and the bit of data have different logic states, the discharging of the actual voltage level on the common read bitline through the one of the memory cells is prevented and indicates the output of the XNOR operation is a low logic state.

18. The method of claim 15, wherein:

the pre-charging further comprises pre-charging common read bitlines and capacitors of the columns of the memory array such that the read pulses selectively applied to only one of the first read wordline and the second read wordline in each of the rows causes the concurrent XNOR operations to be performed by the memory cells in the columns of the memory array; and the method further comprises concurrently performing comparisons of actual voltage levels on the common read bitlines of the columns to the reference voltage level and outputting digital outputs for each of the columns, respectively.

19. The method of claim 18, wherein:

the method enables in-memory computing of binary neural network operations; and the concurrent XNOR operations performed by the memory cells in the columns of the memory array occur in one clock cycle with logic states of first read wordlines corresponding to binary input values from a first receptive field, with logic states of bits stored in the memory cells of the columns corresponding to binary weight values from different kernels associated with different features, respectively, and with digital outputs from voltage comparators of the columns being inserted into different feature maps for the different features at a same location corresponding to the particular receptive field.

20. The method of claim 19, wherein:

the concurrent XNOR operations performed by the memory cells in the columns of the memory array are repeated during subsequent clock cycles such that at each subsequent clock cycle logic states of the first read wordlines correspond to different binary input values from a second receptive field different than the first receptive field;

the logic states of the bits stored in the memory cells of the columns continue to correspond to binary weight values from the different kernels associated with the different features, respectively; and the digital outputs from the voltage comparators of the columns are inserted into the different feature maps for the different features at a location corresponding to the different receptive field.

\* \* \* \* \*